(12) United States Patent
Mitsuyasu et al.

(10) Patent No.: US 12,510,833 B2
(45) Date of Patent: Dec. 30, 2025

(54) IMPRINT APPARATUS, PATTERN FORMING METHOD, AND METHOD OF MANUFACTURING SEMICONDUCTOR DEVICE

(71) Applicant: Kioxia Corporation, Tokyo (JP)

(72) Inventors: Masaki Mitsuyasu, Kuwana Mie (JP); Anupam Mitra, Yokkaichi Mie (JP); Ryo Ogawa, Mie Mie (JP)

(73) Assignee: KIOXIA CORPORATION, Tokyo (JP)

( * ) Notice: Subject to any disclaimer, the term of this patent is extended or adjusted under 35 U.S.C. 154(b) by 192 days.

(21) Appl. No.: 18/456,639

(22) Filed: Aug. 28, 2023

(65) Prior Publication Data
US 2024/0201606 A1 Jun. 20, 2024

(30) Foreign Application Priority Data
Dec. 19, 2022 (JP) .................................. 2022-202348

(51) Int. Cl.
*G03F 7/20* (2006.01)
*G03F 7/00* (2006.01)
*G03F 9/00* (2006.01)

(52) U.S. Cl.
CPC .......... *G03F 9/7042* (2013.01); *G03F 7/2012* (2013.01); *G03F 7/70708* (2013.01)

(58) Field of Classification Search
CPC .. G03F 9/7042; G03F 7/2012; G03F 7/70708; G03F 7/0002
See application file for complete search history.

(56) References Cited

U.S. PATENT DOCUMENTS

| 9,971,256 | B2 | 5/2018 | Yamamoto | |
|---|---|---|---|---|
| 2007/0132157 | A1* | 6/2007 | Tokita | B82Y 40/00 264/494 |
| 2018/0059557 | A1* | 3/2018 | Ota | G03F 9/7069 |
| 2021/0379800 | A1 | 12/2021 | Kitayama | |
| 2022/0063175 | A1* | 3/2022 | Sato | B29C 59/002 |

FOREIGN PATENT DOCUMENTS

| JP | 2017-011268 A | 1/2017 |
|---|---|---|
| JP | 2018-061061 A | 4/2018 |
| JP | 2021-190649 A | 12/2021 |
| TW | 202226427 A | 7/2022 |

* cited by examiner

*Primary Examiner* — Mesfin T Asfaw
(74) *Attorney, Agent, or Firm* — Foley & Lardner LLP

(57) ABSTRACT

An imprint apparatus includes: a chuck including a temperature controller configured to adjust a temperature of a substrate having a shot region, the chuck configured to hold the substrate; a template stage configured to hold a template so that a surface of the template with a pattern faces the substrate and configured to change a relative position of the substrate to the template in a vertical direction; and a controller configured to control the chuck and the template stage. The controller is configured to control the temperature controller such that the temperature of the substrate is adjusted based on a magnification error between the pattern and the shot region. The controller controls the template stage such that the pattern is transferred to the shot region of the substrate of which the temperature is adjusted.

15 Claims, 14 Drawing Sheets

IMPRINT APPARATUS, PATTERN FORMING METHOD, AND METHOD OF MANUFACTURING SEMICONDUCTOR DEVICE

CROSS-REFERENCE TO RELATED APPLICATION

This application is based upon and claims the benefit of priority from Japanese Patent Application No. 2022-202348, filed Dec. 19, 2022, the entire contents of which are incorporated herein by reference.

FIELD

Embodiments described herein relate generally to an imprint apparatus, a pattern forming method, and a method of manufacturing a semiconductor device.

BACKGROUND

Processes of manufacturing semiconductor devices include imprint processes in some cases. In imprint processes, patterns of templates are transferred to shot regions of substrates. At this time, when pattern sizes of templates are different from sizes of shot regions due to manufacturing errors of templates or the like, side surfaces of the templates are pressed with pressing members to correct pattern ratios of the templates.

However, the pattern sizes and the sizes of the shot regions exceed ranges in which the ratios can be corrected by the pressing members, and thus these sizes do not match each other. When corrected relative ratios between the pattern sizes and the sizes of the shot regions are excessive or deficient, overlapping errors of patterns on the substrates may increase.

DETAILED DESCRIPTION

Embodiments provide an imprint apparatus, a pattern forming method, and a method of manufacturing a semiconductor device capable of improving overlapping accuracy of a pattern on a substrate by reducing a magnification error between a shot region and the pattern.

In general, according to at least one embodiment, an imprint apparatus incudes: a chuck including a temperature control unit (temperature controller) configured to adjust a temperature of a substrate having a shot region and configured to hold the substrate; a template stage configured to hold a template so that a surface with a pattern faces the substrate and configured to change a relative position of the substrate to the template in a vertical direction; and a controller configured to control the chuck and the template stage. The controller is configured to control the temperature controller such that the temperature of the substrate is adjusted based on a magnification error between the pattern and the shot region. The controller is configured to control the template stage such that the pattern is transferred to the shot region of the substrate of which the temperature is adjusted.

Hereinafter, embodiments of the present disclosure will be described in detail with reference to the drawings. The present disclosure is not limited by the following embodiment. Elements in the following embodiment include elements easily assumed by those skilled in the art or substantially the same elements.

(Configuration Example of Imprint Apparatus)

Figure 1A:
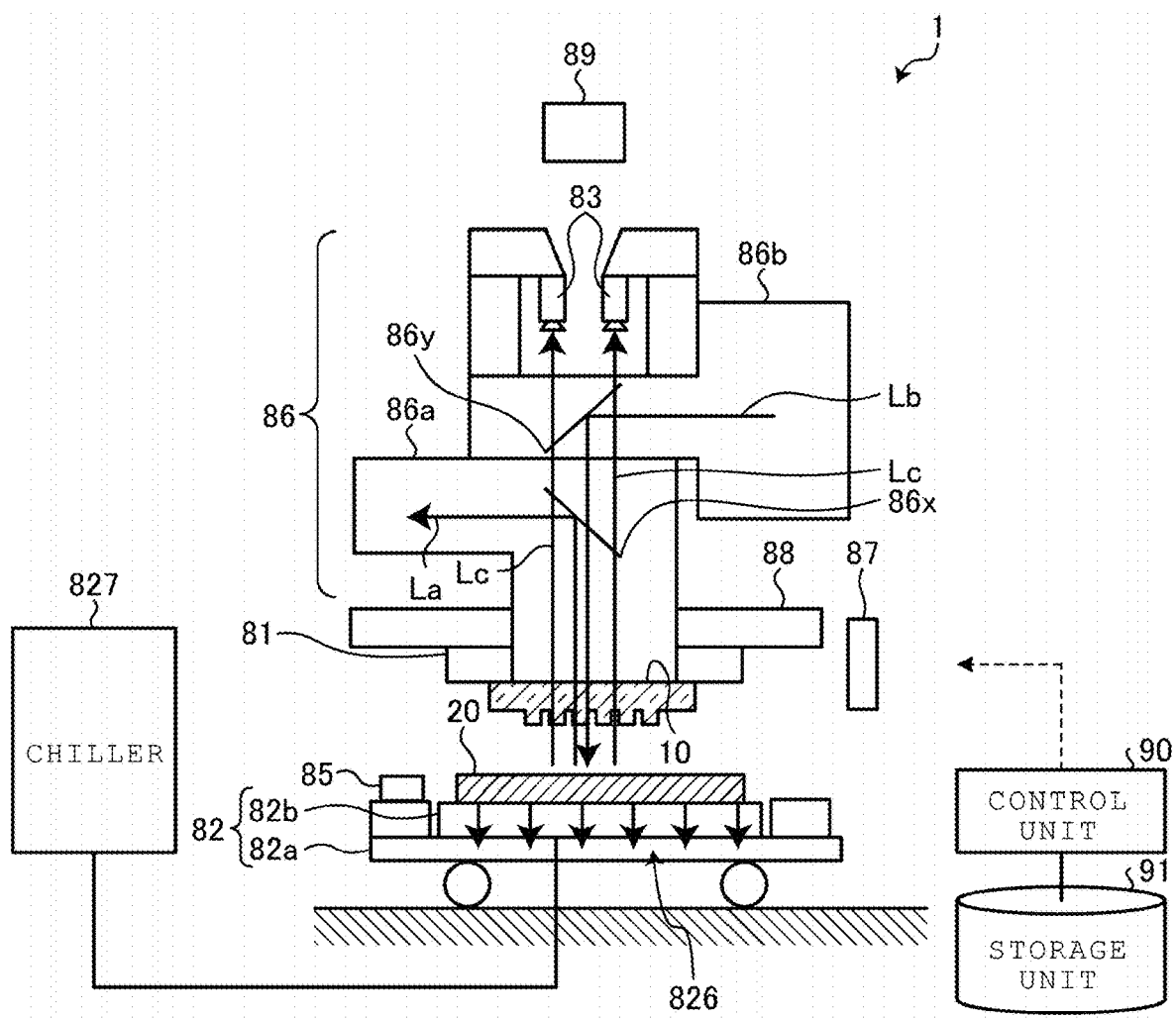
FIGS. 1A and 1B are schematic views illustrating an example of a configuration of an imprint apparatus according to at least one embodiment.
Figure 1B:
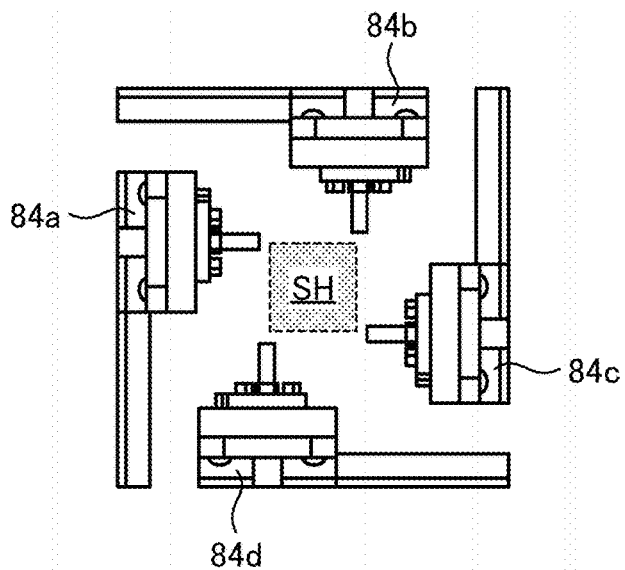

FIGS. 1A and 1B are schematic views illustrating an example of a configuration of an imprint apparatus 1 according to an embodiment. FIG. 1A is a diagram illustrating the overall imprint apparatus 1 and FIG. 1B is an enlarged view illustrating a detection system 86a and illustrating a detailed configuration of image sensors 84 (84a to 84d) provided in the imprint apparatus 1.

As illustrated in FIGS. 1A and 1B, the imprint apparatus 1 includes a template stage 81, a wafer stage 82, image sensors 83 and 84a to 84d, a reference mark 85, an alignment unit 86, a liquid dropping device 87, a stage base 88, a light source 89, a control unit 90, and a storage unit 91. A template 10 that transfers a pattern to a resist on a wafer 20 can be mounted on the imprint apparatus 1.

The wafer stage 82 includes a wafer chuck 82b and a body 82a. The wafer chuck 82b includes a plurality of suction passages 82b connected to pumps (not illustrated), respectively, and is configured as a suction chuck that adsorbs the wafer 20 at a predetermined position on the body 82a by sucking the wafer 20. A chiller 827 that circulates a refrigerant in the wafer chuck 82b is connected to the wafer chuck 82b and adjusts a temperature of the wafer 20 placed on the wafer chuck 82b. The chiller 827 forms a part of a temperature control unit of the imprint apparatus, as will be described below.

The reference mark 85 is provided on the wafer stage 82. The reference mark 85 is used for alignment when the wafer 20 is loaded onto the wafer stage 82.

The wafer stage 82 on which the wafer 20 is placed is moved within a plane (within a horizontal plane) parallel to the placed wafer 20. The wafer stage 82 can move along horizontal direction and the wafer stage 82 moves the wafer 20 below the liquid dropping device 87 when a resist is dropped to the wafer 20. The wafer stage 82 moves the wafer 20 below the template 10 when a transferring process on the wafer 20 is performed.

The stage base 88 presses a pattern of the template 10 against the resist on the wafer 20 by supporting the template 10 by the template stage 81 and moving the template 10 in the vertical direction (the perpendicular direction).

An alignment unit 86 including the plurality of image sensor 83 is provided on the stage base 88. The alignment unit 86 detects a position of the wafer 20 and detects a position of the template 10 based on alignment marks provided in the wafer 20 and the template 10, respectively.

The alignment unit 86 includes a detection system 86a and an illumination system 86b. The illumination system 86b illuminates the wafer 20 and the template 10 so that the alignment marks formed on the wafer 20 and the template 10 can be viewed. The detection system 86a aligns the wafer 20 with the template 10 by detecting images of the alignment marks and performing alignment.

The detection system 86a and the illumination system 86b include mirrors 86x and 86y such as dichroic mirrors serving as image forming units, respectively. The mirrors 86x and 86y form images of the alignment marks from the wafer 20 and the template 10 by light from the illumination system 86b.

Specifically, light Lb from the illumination system 86b is reflected to a lower side on which the wafer 20 and the like are disposed by the mirror 86y. Light La from the wafer 20 or the like is reflected toward the detection system 86a by the mirror 86x. Partial light Lc from the wafer 20 or the like transmits through the mirrors 86x and 86y and travels toward the image sensors 83 on the upper side.

The image sensors 83 image the partial light Lc as images including the alignment marks or the like. The images captured by the image sensors 83 are used for the control unit 90 to observe an alignment state.

On the other hand, the light La reflected toward the detection system 86a by the mirror 86x travels toward the plurality of image sensors 84a to 84d provided in the detection system 86a.

As illustrated in FIG. 1B, the plurality of image sensors 84a to 84d are able to image different points of one shot region SH on the wafer 20 which is, for example, an imprint region of the template 10.

The image sensors 84a to 84d image the light La reflected by the mirror 86x as images including the alignment marks or the like. The images captured by the image sensors 84a to 84d are used for the control unit 90 to align the wafer 20 with the template 10.

The image sensors 83 and 84a to 84d are examples of an imaging unit that images the wafer 20 via the template 10.

The liquid dropping device 87 is a device that drops a resist onto the wafer 20 in conformity with an inkjet scheme. An inkjet head provided in the liquid dropping device 87 has a plurality of minute holes through which liquid droplets of the resist are ejected and drops the liquid droplets of the resist to one shot region SH on the wafer 20.

The imprint apparatus 1 according to the embodiment is configured such that the resist is dropped onto the wafer 20, but a resist may be applied to the entire surface of the wafer 20 by a spin coating application method.

The light source 89 is, for example, a device that emits light such as ultraviolet light for hardening a resist and is provided above the stage base 88. The light source 89 emits the light onto the template 10, with the template 10 being pressed against the resist.

The control unit 90 is configured as, for example, a computer that includes a hardware processor such as a central processing unit (CPU), a memory, and a hard disk drive (HDD). The control unit 90 controls the template stage 81, the wafer stage 82, the reference mark 85, the alignment unit 86 including the image sensors 83 and 84a to 84d, the liquid dropping device 87, the stage base 88, and the light source 89.

The storage unit 91 stores, for example, a control program which is executed by the CPU of the control unit 90, various control parameters necessary for an operation of the CPU, and the like. The storage unit 91 stores various types of information regarding the template 10 mounted on the template stage 81 and the wafer 20 which is an imprint processing target.

Information regarding the template 10 and the wafer 20 is, for example, design data of the template 10, measurement data of the template 10 measured by another measurement device or the like, design data of the wafer 20, measurement data of the wafer 20 measured by another measurement device or the like, and the like. The imprint apparatus 1 acquires, for example, the data from a design apparatus, a measurement apparatus, or the like in advance and stores the data in the storage unit 91.

Next, a detailed configuration example of the wafer chuck 82b provided in the imprint apparatus 1 will be described with reference to FIGS. 2 and 3.

Figure 2A:
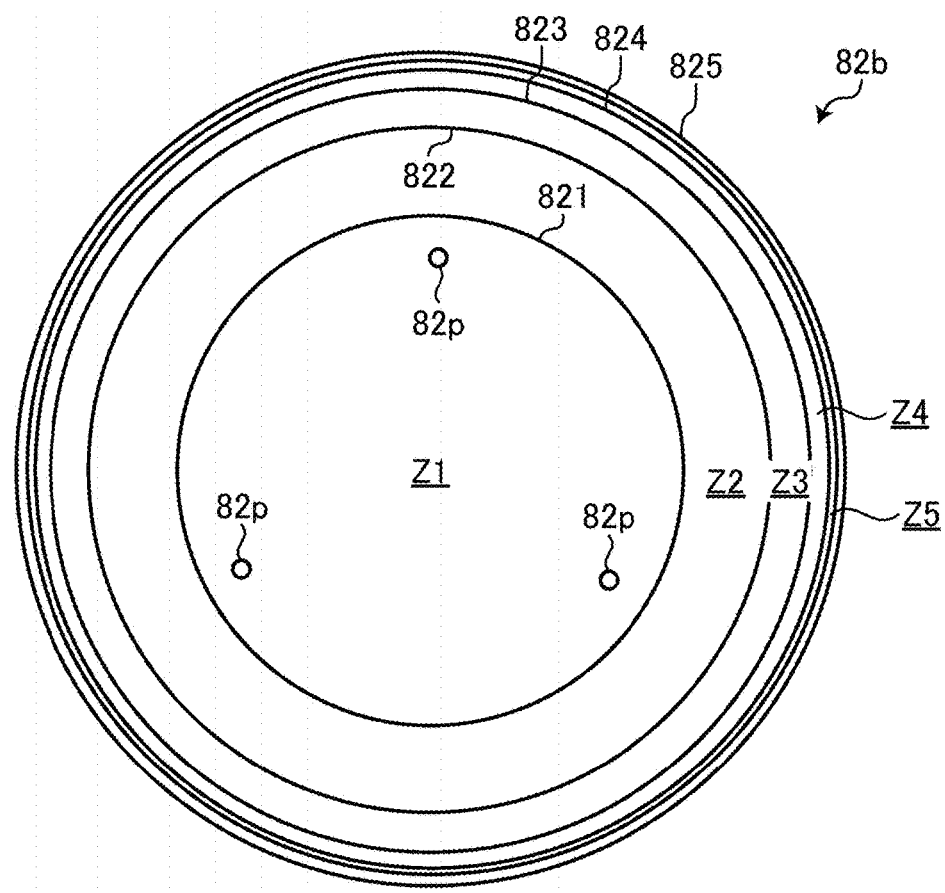
FIGS. 2A and 2B are schematic views illustrating an example of a configuration of a wafer chuck provided in the imprint apparatus.
Figure 2B:
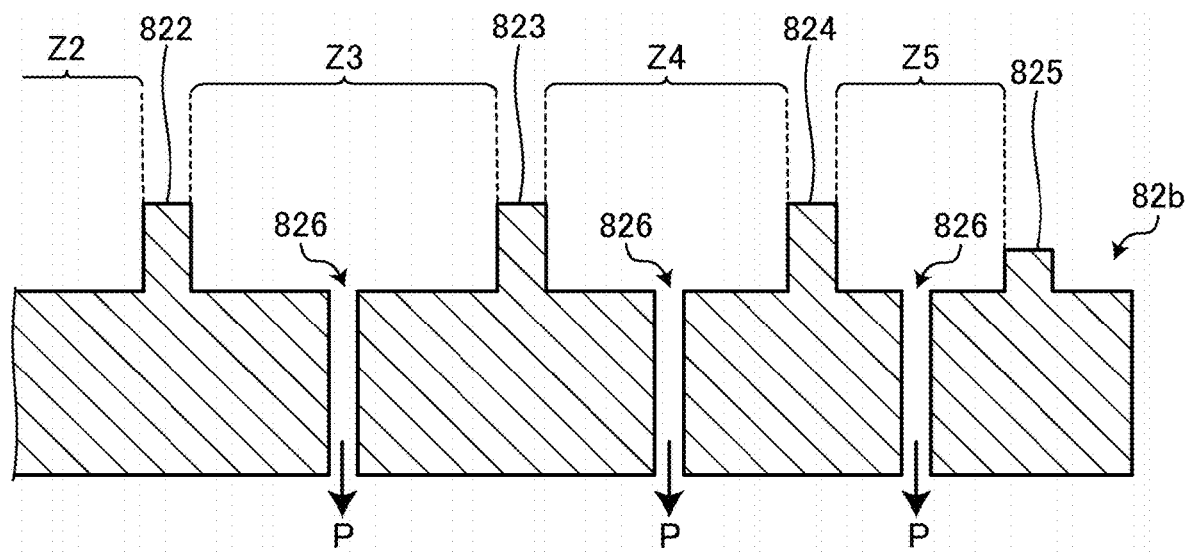

FIGS. 2A and 2B are schematic views illustrating an example of a configuration of the wafer chuck 82b provided in the imprint apparatus 1 according to the embodiment. FIG. 2A is a top view illustrating the wafer chuck 82b and FIG. 2B is a partially enlarged sectional view illustrating the wafer chuck 82b.

As illustrated in FIG. 2A, the wafer chuck 82b serving as a suction chuck is divided into a plurality of zones Z1 to Z5 by a plurality of ring protrusions 821 to 825.

The plurality of ring protrusions 821 to 825 are concentric from the inside to the outside of the wafer chuck 82b in this order. Intervals of the ring protrusions 821 to 825 are narrowed toward the outside of the wafer chuck 82b.

The zone Z1 is a further inner annular region of the ring protrusion 821 disposed closest to the center of the wafer chuck 82b. In the zone Z1, a plurality of pin holes 82p are provided. Wafer pins (not illustrated) are stored in the plurality of pin holes 82p. When the wafer 20 is imported or exported, the wafer pins protrude from the front surface of the wafer chuck 82b to hold the wafer 20 above the wafer chuck 82b.

The zone Z2 is an annular region located between the ring protrusions 821 and 822. The zone Z3 is an annular region located between the ring protrusions 822 and 823. The zone Z4 is an annular region located between the ring protrusions 823 and 824. The zone Z5 is an annular region located between the ring protrusions 824 and 825.

As illustrated in FIG. 2B, the plurality of ring protrusions 821 to 825 protrude from the front surface of the wafer chuck 82b. Of the plurality of ring protrusions 821 to 825, protrusion heights of the ring protrusions 821 to 824 are equal to each other. The ring protrusion 825 disposed in the outermost circumference of the wafer chuck 82b has a protrusion height lower than the other ring protrusions 821 to 824.

In the wafer chuck 82b, a plurality of suction passages 826 connected to a pump P on the downstream side are provided. The suction passages 826 are opened to the zones Z1 to Z5 divided by the plurality of ring protrusions 821 to 825, respectively.

The suction passage 826 is not opened further outside of the ring protrusion 825 disposed toward the outermost circumference of the wafer chuck 82b, that is, to an annular region until the outer edge of the wafer chuck 82b outside of the zone 5.

The wafer 20 is placed on the wafer stage 82 with the rear surface being supported by the upper ends of at least the ring protrusions 821 to 824 among the plurality of ring protrusions 821 to 825. Accordingly, an inner region of the wafer 20 is disposed at positions overlapping with the zones Z1 to Z4 of the wafer chuck 82b, and the outer edge of the wafer 20 is disposed at a position overlapping with the zone Z5 of the wafer chuck 82b.

The wafer 20 is adsorbed to the upper surface of the wafer chuck 82b by operating the pump P connected to the plurality of suction passages 826 with the wafer 20 being supported by the upper ends of the ring protrusions 821 to 824 and sucking the rear surface of the wafer 20 from a plurality of openings of the suction passages 826 provided in respective zones Z1 to Z5.

At this time, for example, by controlling an operation state of the pump P, it is possible to adjust a suction force for each of the zones Z1 to Z5. Not only can the rear surface of the wafer 20 be sucked to form a negative pressure, but the rear surface of the wafer 20 can also be sucked to form a positive pressure. The suction force for each of the zones Z1 to 25 can be adjusted by providing a valve or the like of each of the plurality of suction passages 826 by opening and closing the valve. Thereby, for example, the number of pumps P connected to the suction passages 826 can be reduced.

Figure 3A:
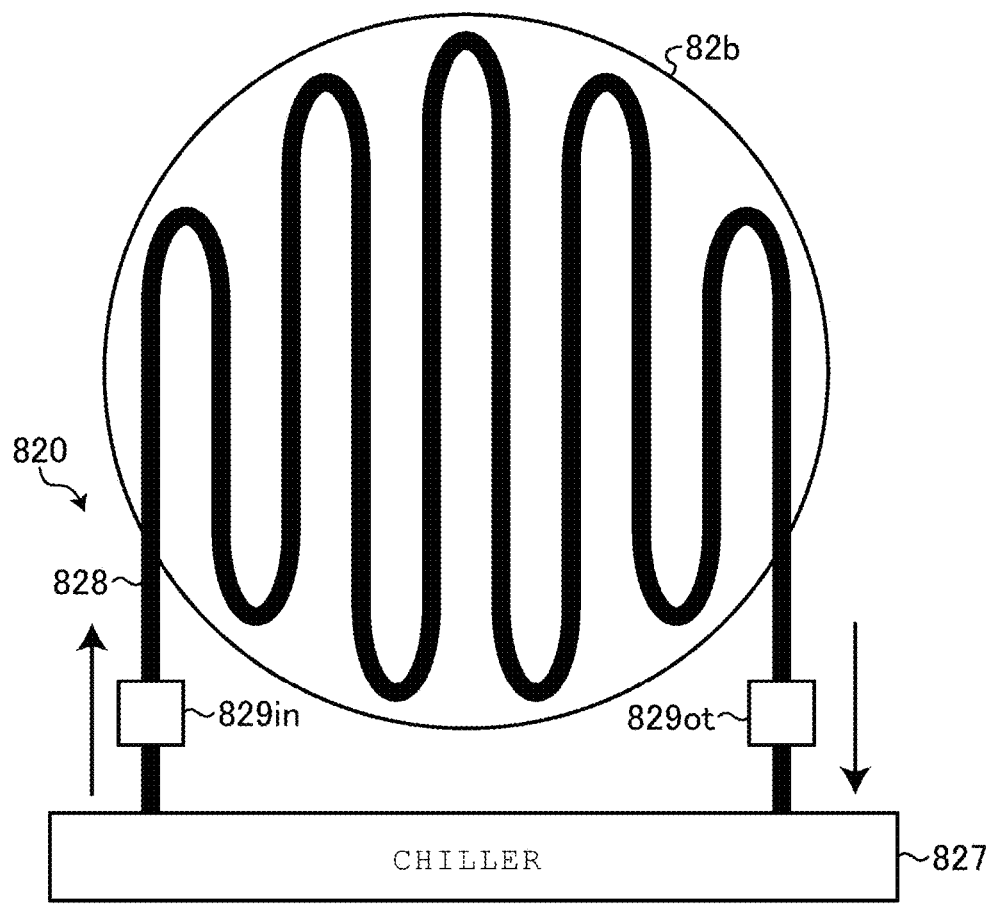
FIGS. 3A and 3B are schematic views illustrating an example of a configuration of a temperature control unit provided in the imprint apparatus.
Figure 3B:
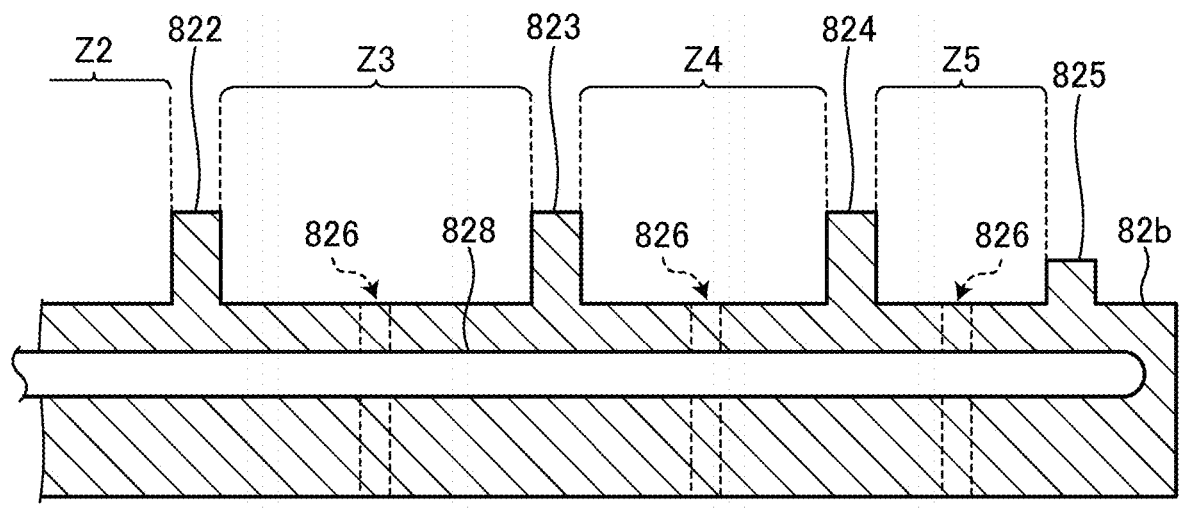

FIGS. 3A and 3B are schematic views illustrating an example of a configuration of a temperature control unit 820 provided in the imprint apparatus 1 according to the embodiment. FIG. 3A is a top perspective view illustrating the wafer chuck 82b and FIG. 3B is a partially enlarged sectional view illustrating the wafer chuck 82b. FIG. 3B is a sectional view different from the sectional view of FIG. 2B.

As described above, the wafer chuck 82b of the imprint apparatus 1 includes the temperature control unit 820 capable of adjusting a temperature of the placed wafer 20. During an imprint process, the temperature control unit 820 changes the temperature of the wafer 20 to control a coefficient of expansion or a coefficient of contraction of the wafer 20 such that a pattern of the template 10 is transferred at desired dimensions to the wafer 20.

As illustrated in FIGS. 3A and 3B, the temperature control unit 820 includes the chiller 827, a refrigerant flow passage 828, and temperature sensors 829in and 829ot.

The chiller 827 is connected to the wafer chuck 82b, as described above, and is configured such that a refrigerant controlled to a predetermined temperature can be circulated in the wafer chuck 82b. That is, the refrigerant is ejected from an ejection port of the chiller 827 to the wafer chuck 82b and flows in an inflow port of the chiller 827 to be circulated between the chiller 827 and the wafer chuck 82b. As the refrigerant, for example, fluorocarbon such as ethylene glycol, water, or another liquid is used depending on a desired temperature range.

The refrigerant flow passage 828 is located at a predetermined depth position in the wafer chuck 82b and is provided along the front surface of the wafer chuck 82b, that is, the surface on which the wafer 20 is placed. In the example illustrated in FIG. 3A, the refrigerant flow passage 828 meanders from an inflow port at one end of the wafer chuck 82b to an outflow port at the other end of the wafer chuck 82b along the surface on which the wafer chuck 82b is placed. At this time, the refrigerant flow passage 828 is configured to pass through regions where the suction passages 826 are not provided to avoid interference between the above-described suction passages 826.

By circulating the refrigerant controlled to the predetermined temperature in the refrigerant flow passage 828, it is possible to adjust the temperature of the wafer 20 adsorbed to the wafer chuck 82b.

The temperature sensor 829in is provided near the inflow port of the refrigerant flow passage 828 to the wafer chuck 82b to detect a temperature of the refrigerant flowing in the wafer chuck 82b. The temperature sensor 829ot is provided near the outflow port of the refrigerant flow passage 828 from the wafer chuck 82b to detect the temperature of the refrigerant flowing out from the wafer chuck 82b. Detection results of the temperature by the temperature sensors 829in and 829ot are output to the chiller 827. Based on the detection results, the chiller 827 performs control such that the refrigerant becomes a desired temperature.

The number of refrigerant flow passages 828 provided in the wafer chuck 82b, a diameter of the refrigerant flow passages 828, an extension direction and the like of the refrigerant flow passages 828 in the wafer chuck 82b can be appropriately set. That is, to adjust the temperature of the wafer 20 accurately, the number of refrigerant flow passages 828 may be more than in the example of FIGS. 3A and 3B. Also, the number of turns of the refrigerant flow passages 828 in the wafer chuck 82b may be more or less than in the example of FIG. 3. In the example of FIGS. 3A and 3B, the wafer 20 is placed in the wafer chuck 82b so that, for example, notches face in the lower direction of the paper surface, and thus extension directions and turn directions of the refrigerant flow passages 828 in the wafer chuck 82b are the vertical direction of the paper surface. However, the extension directions and the turn directions of the refrigerant flow passages 828 may be the horizontal direction of the paper surface or other directions.

Next, detailed configuration examples of the template stage 81 provided in the imprint apparatus 1 and the template 10 mounted on the template stage 81 will be described with reference to FIGS. 4A to 4C.

Figure 4A:
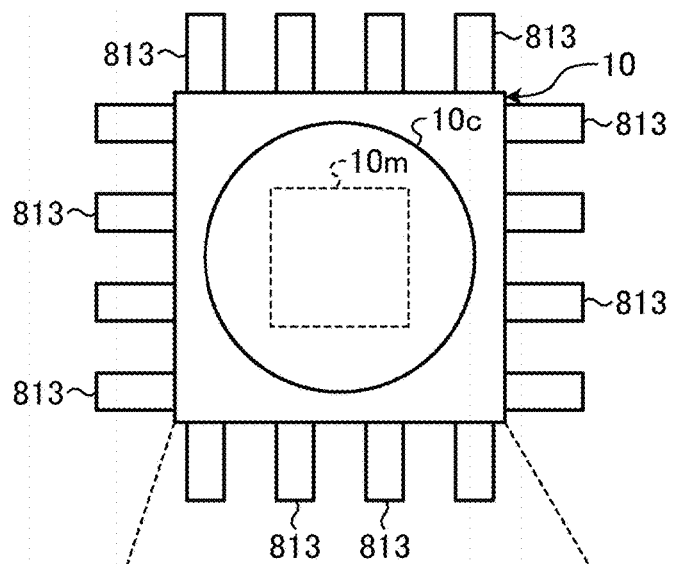
FIGS. 4A to 4C are schematic views illustrating an example of a configuration of a template stage provided in the imprint apparatus.
Figure 4B:
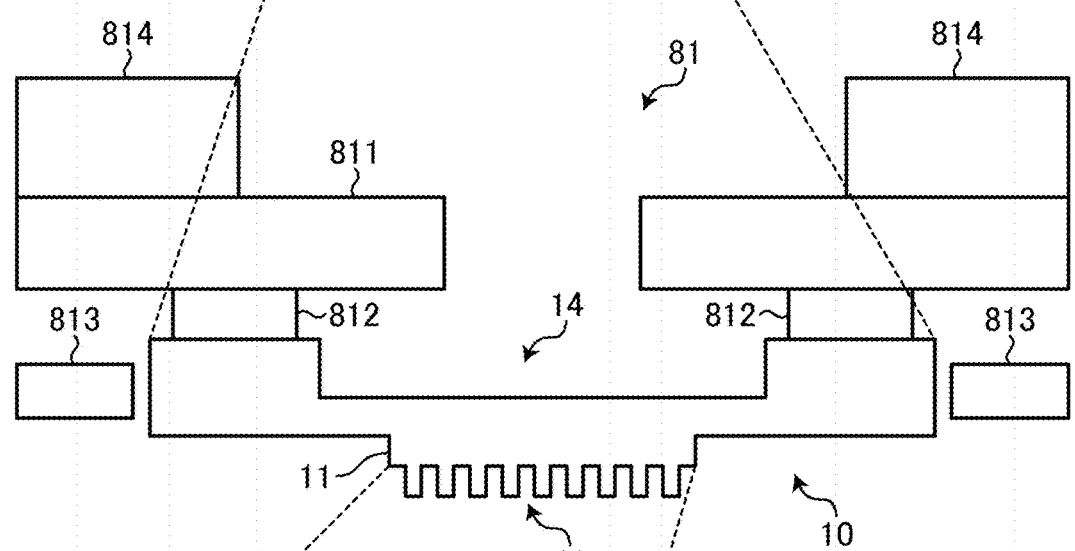
Figure 4C:
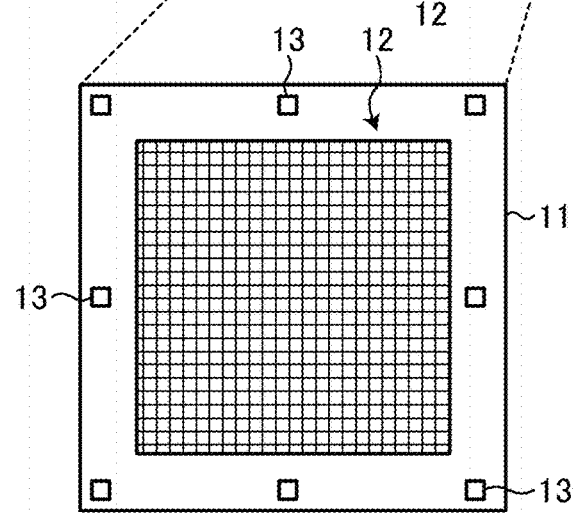

FIGS. 4A to 4C are schematic views illustrating an example of a configuration of the template stage 81 provided in the imprint apparatus 1 according to at least one embodiment. FIG. 4A is a top view illustrating the template 10 held on the template stage 81 and pressing members 813 provided in the template stage 81. FIG. 4B is a sectional view illustrating the template stage 81. FIG. 4B is a top view illustrating a pattern 12 of the template 10 held on the template stage 81.

As illustrated in FIGS. 4A to 4C, the template stage 81 includes a body 811, a template chuck 812, the pressing members 813, and a driving unit 814.

The body 811 of the template stage 81 is a flat member and holds the template 10 on the lower surface by the template chuck 812. The template chuck 812 is provided on the lower surface of the body 811 and is vacuum-adsorbed by a suction mechanism (not illustrated) to hold the pattern 12 on the lower side and the template 10 on the upper side of the wafer 20.

The driving unit 814 lifts and lowers the template stage 81 by a motor or the like (not illustrated) with the template 10 being held. At this time, by adjusting a driving force of the motor the like of the driving unit 814, it is possible to control a lifting speed of the template stage 81, an inclination of the template 10 with respect to the wafer 20, a pressing force of the pattern 12 of the template 10 against the resist on the wafer 20, and the like.

The driving unit 814 moves the template stage 81 in a vertical direction, by the motor or the like (not illustrated) with the template 10 being held. Accordingly, a relative position of the template 10 to the wafer 20 in the vertical direction is adjusted.

As illustrated in FIGS. 4A and 4B, the plurality of pressing members 813 surround the outer edge of the template 10 held by the template chuck 812. The plurality of pressing members 813 include, for example, actuators or the like and are configured such that the side surface of the template 10 presses different positions.

Here, a size of the pattern 12 of the template 10 varies depending on a manufacturing error or the like. Therefore, for example, the pattern 12 is designed to have a size slightly larger than the short region SH (see FIG. 1B) on the wafer 20. For example, when the size of the pattern 12 is expressed at magnification, the pattern 12 is designed to have a size larger than the shot region SH on the wafer 20 by, for example, about 2 ppm to 3 ppm.

By pressing the side surface of the template 10 by the plurality of pressing members 813 that have the above-described configuration, contracting the template 10, and changing the size of the pattern 12 of the template 10, that is, the magnification of the pattern 12, it is possible to match the size of the pattern 12 with the size of the shot region SH of the wafer 20.

The template 10 is a substantially flat substrate such as a quartz member and includes a mesa portion 11 protruding from the lower surface with the template 10 being held on the template stage 81 and the pattern 12 formed on the surface of the mesa portion 11. A recessed portion called a core-out portion 14 is provided on the rear surface of the template 10, that is, the surface opposite to the pattern 12.

As illustrated in FIG. 4C, the pattern 12 of the template 10 is, for example, a pattern that has any shape such as a line-and-space pattern, a dot pattern, or a hole pattern and is transferred to the resist on the wafer 20. A region to which the pattern 12 on the wafer 20 is transferred is an element region of a semiconductor device.

The plurality of alignment marks 13 are provided around the pattern 12 of the template 10. The individual alignment marks 13 serving as second alignment marks have, for example, a recessed shape depressed from a contact surface with the resist when the template 10 is pressed against the resist on the wafer 20.

(Method of Manufacturing Semiconductor Device)

Next, a method of manufacturing a semiconductor device according to the embodiment will be described with reference to FIGS. 5 to 8C. Processes of manufacturing the semiconductor device according to the embodiment include an imprint process by the above-described imprint apparatus 1.

Figure 5A:
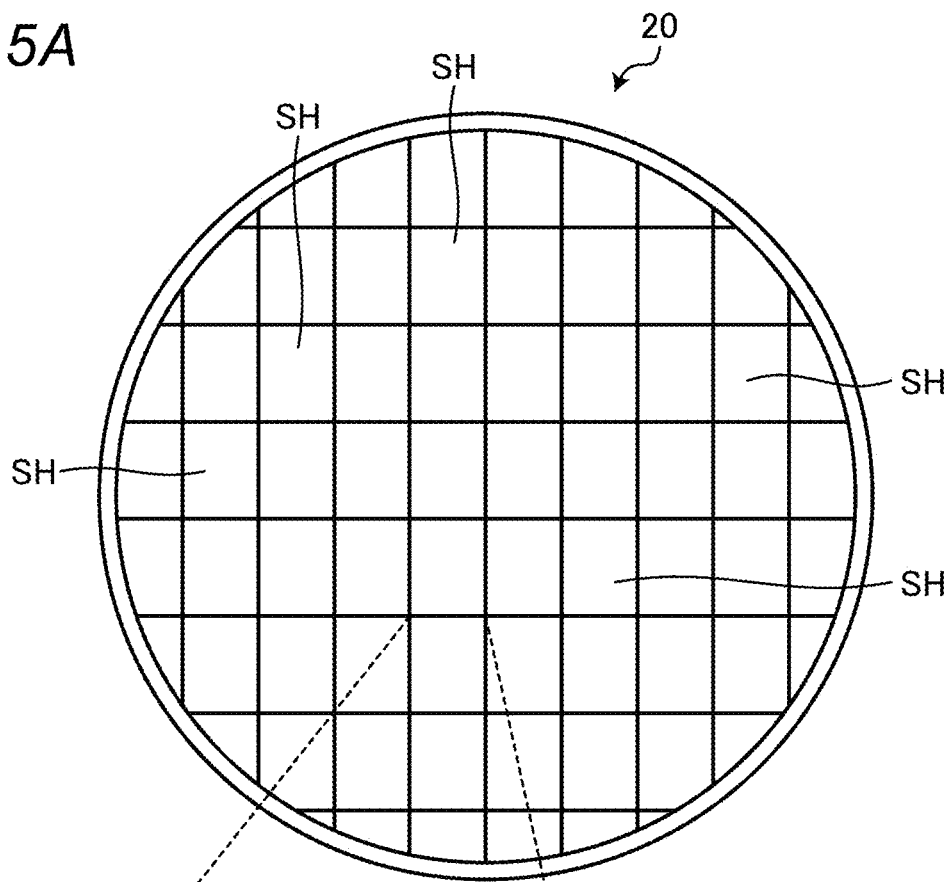
FIGS. 5A and 5B are top views illustrating an example of a configuration of a wafer.
Figure 5B:
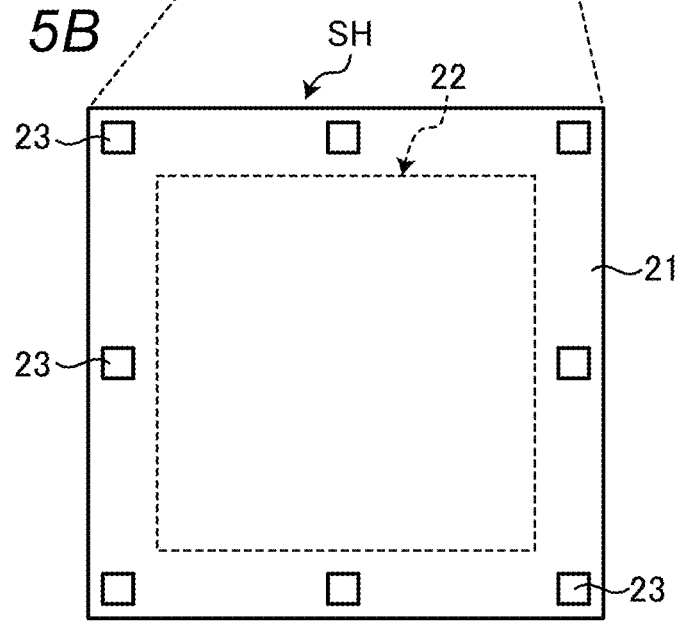

First, FIGS. 5A and 5B illustrate an example of the wafer 20 which is a processing target of the imprint apparatus 1. FIGS. 5A and 5B are schematic views illustrating an example of a configuration of the wafer 20 according to the embodiment. FIG. 5A is a top view illustrating the wafer 20 and FIG. 5B is a top enlarged view illustrating one shot region SH.

As illustrated in FIG. 5A, the upper surface of the wafer 20 serving as a substrate is partitioned into the plurality of shot regions SH. The plurality of shot regions SH have, for example, a rectangular shape and are disposed in a matrix form on the entire surface of the wafer 20.

The shot region SH is a region which is a processing unit per time in any process including an imprint process among the plurality of manufacturing processes for the semiconductor device. That is, for example, in the imprint process to be described below, a process of transferring the pattern 12 of the template 10 is performed for each shot region SH.

As illustrated in FIG. 5B, the individual shot region SH has a transfer region 22 to which the pattern 12 of the template 10 is transferred in a middle portion. That is, the transfer region 22 may have, for example, an area and a shape which are substantially the same as the area and the shape of the pattern 12 of the above-described template 10. The transfer region 22 is an element region of the semiconductor device after a predetermined process is performed. One or a plurality of semiconductor devices can be obtained from the element region.

The plurality of alignment marks 23 are provided around the transfer region 22. The alignment marks 23 serving as the first alignment marks are formed in a processed film 21 formed, for example, on the upper surface of the wafer 20, an underlayer film of the processed film 21, or the wafer 20. The individual alignment marks 23 are used as pairs of the corresponding alignment marks 13 of the above-described template 10 and are used for alignment between the wafer 20 and the template 10.

FIGS. 6A to 8C are sectional views illustrating sequentially a part of a procedure of the method of manufacturing the semiconductor device according to the embodiment.

In FIGS. 6A to 8C, processes illustrated in FIGS. 6A to 8A are examples of a procedure of an imprint method by the imprint apparatus 1. The processes illustrated in FIGS. 6A to 8A are also a pattern forming method of forming the pattern 12 of the template 10 in the resist film 30 formed on the wafer 20. In this way, the imprint process by the imprint apparatus 1 and the pattern forming process are performed as one process of the processes of manufacturing the semiconductor device.

Figure 6A:
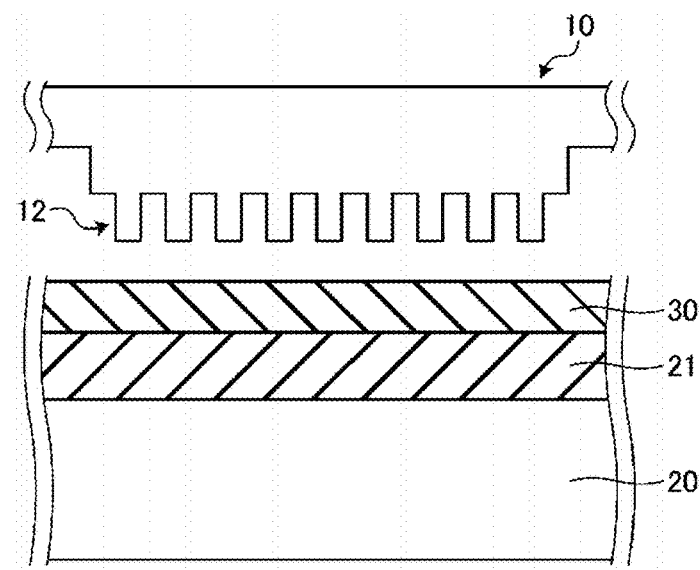
FIGS. 6A to 6C are sectional views sequentially illustrating a part of a procedure of a method of manufacturing a semiconductor device.

As illustrated in FIG. 6A, for example, the processed film 21 is formed in the wafer 20. The processed film 21 is, for example, a silicon oxide film, a silicon nitride film, a metal film, or the like and is a film that is processed in a form corresponding to the pattern 12 of the template 10.

At a stage of the manufacturing process on the wafer 20, one or a plurality of underlayer films may be formed below the processed film 21. Alternatively, when the imprint process is performed in order to process the front surface of the wafer 20, the processed film 21 may be a surface layer of the wafer 20 which is a silicon wafer or the like.

In the processed film 21, the underlayer film, or the wafer 20, as described above, the plurality of alignment marks 23 used for alignment with the template 10 are formed.

The wafer 20 is imported in the imprint apparatus 1 by a conveyance mechanism (not illustrated) and is placed on the wafer chuck 82b of the imprint apparatus 1 to be adsorbed. At this time, the control unit 90 of the imprint apparatus 1 acquires design data of a configuration formed in the wafer 20 in the manufacturing process and wafer information such as measurement data obtained by measuring dimensions, shape, formation position, and the like of such a configuration from the design apparatus, the measurement apparatus, and the like, and stores the design data and the wafer information in the storage unit 91.

The template 10 having the pattern 12 transferred to the wafer 20 which is a processing target is imported in the imprint apparatus 1 by the conveyance mechanism (not illustrated) and is mounted on the template chuck 812 of the imprint apparatus 1. At this time, the control unit 90 of the imprint apparatus 1 acquires design data of the pattern 12 provided in the template 10 and template information such as measurement data obtained by measuring dimensions of the pattern 12, the exterior form, and the like from other apparatuses and stores the design data and the template information in the storage unit 91.

Images of the vertically overlapped alignment marks 13 and 23 of the template 10 and the wafer 20 are captured by moving the wafer stage 82 on which the wafer 20 is held to the lower side of the template 10 held by the template chuck 812 and observing the wafer 20 through the template 10 by, for example, the image sensors 83.

The control unit 90 of the imprint apparatus 1 calculates a magnification error between the pattern 12 of the template 10 and the short region SH of the wafer 20 based on the wafer information and the template information acquired from the other apparatuses and the images of the alignment marks 13 and 23 captured by the image sensors 83. The control unit 90 reduces the magnification error by changing the temperature of the wafer 20 by the above-described temperature control unit 820 and expanding or contracting the wafer 20. A detailed technique for changing the magnification of the shot region SH by the control unit 90 will be described below.

Thereafter, the wafer stage 82 on which the wafer 20 is held is moved to the lower side of the liquid dropping device 87. The liquid dropping device 87 drops a resist in conformity with an inkjet scheme onto the processed film 21 of the shot region SH subjected to the imprint process from now among the plurality of shot regions SH.

The resist dropped from the liquid dropping device 87 is an organic-based material such as a photo-hardening resist by radiating, for example, ultraviolet light or the like. When liquid droplets are dropped from the liquid dropping device 87, the resist is in an unhardened state.

Accordingly, a resist film 30 serving as a resin film is formed on the processed film 21 of one shot region SH.

In this way, the unhardened resist film 30 formed in conformity with the inkjet scheme may be located in a liquid droplet form in the shot region SH irrespective of the example of FIG. 6A. As described above, the resist film 30 may be formed by applying the resist by a spin coating application method. In this case, the resist film 30 is formed substantially uniformly on the entire surface of the wafer 20.

The shot region SH on which the imprint process is performed from now is disposed below the template 10 held on the template stage 81 of the imprint apparatus 1 by moving the wafer stage 82 on which the wafer 20 is held. Even at this time, the vertically overlapped alignment marks 13 and 23 of the template 10 and the wafer 20 are observed by, for example, the image sensors 83.

Figure 6B:
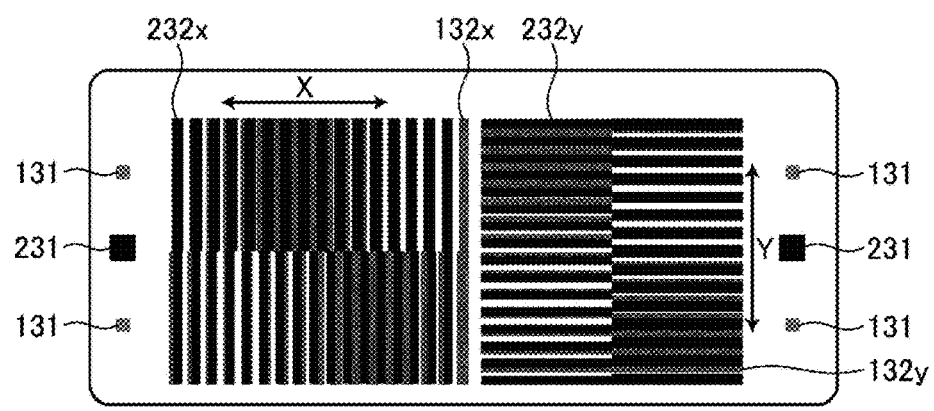

As illustrated in FIG. 6B, the individual alignment marks 23 of the wafer 20 include rough inspection marks 231 serving as first rough inspection marks and fine inspection marks 232x and 232y serving as first fine inspection marks. The individual alignment marks 13 of the template 10 include rough inspection marks 131 serving as second rough inspection marks and fine inspection marks 132x and 132y serving as second fine inspection marks.

A pair of rough inspection marks 131 provided in the alignment marks 13 of the template 10 are located in the Y direction, for example, at each of both ends of a region where the alignment marks 13 are provided in the X direction. The rough inspection mark 231 provided in the alignment marks 23 of the wafer 20 is provided between the pair of rough inspection marks 131 located in the Y direction at each of both ends of a region where the alignment marks 23 are provided in the X direction.

Both the X and Y directions are directions along a surface facing the template 10 and the wafer 20 and are orthogonal to each other. In FIG. 6B, the X direction is a horizontal direction of the paper surface and the Y direction is the vertical direction of the paper surface.

The rough inspection marks 131 and 231 in the alignment marks 13 and 23 provided at the mutually corresponding positions of the template 10 and the wafer 20 are used for substantial alignment between the template 10 and the wafer 20.

The fine inspection marks 132x and 132y provided in the alignment marks 13 of the template 10 are provided, for example, between the rough inspection marks 131 at both ends in the X direction. The fine inspection marks 132x have a periodic structure in the X direction. The fine inspection marks 132y have a periodic structure in the Y direction. The fine inspection marks 232x and 232y provided in the alignment marks 23 of the wafer 20 are provided, for example, between the rough inspection marks 231 at both ends in the X direction. The fine inspection marks 232x have a periodic structure of a period different from that of the fine inspection marks 132x in the X direction. The fine inspection marks 232y have a periodic structure of a period different from that of the fine inspection marks 132y in the Y direction.

In the alignment marks 13 and 23 provided at the mutually corresponding positions of the template 10 and the wafer 20, the fine inspection marks 132x and 232x are used for fine alignment between the template 10 and the wafer 20 in the X direction. The fine inspection marks 132y and 232y are used for fine alignment between the template 10 and the wafer 20 in the Y direction.

The control unit 90 of the imprint apparatus 1 substantially aligns positions of the template 10 and the wafer 20 in a direction along the surface direction, that is, the positions in the X and Y directions, as described above, while observing the rough inspection marks 131 and 231 of the template 10 and the wafer 20 by, for example, the image sensors 83.

Ideally, the pair of rough inspection marks 131 and the rough inspection mark 231 of the wafer 20 disposed on one side in the X direction are located in a straight line in the Y direction to be aligned in the X direction. The rough inspection mark 231 of the wafer 20 is disposed at a central position of the pair of rough inspection marks 131 in the Y direction disposed on one side in the X direction to be located in the Y direction.

In this way, the alignment performed using the rough inspection marks 131 and 231 is also referred to as rough inspection, rough alignment, or the like. Actually, between the template 10 and the wafer 20, a predetermined alignment error is allowed to occur in both the X and Y directions.

When the rough alignment is performed, at least one of the wafer 20 and the template 10 may be rotated in a rotational direction in a plane by at least one of the wafer stage 82 and the template stage 81 to perform alignment between the shot region SH and the pattern 12 in the rotational direction.

Figure 6C:
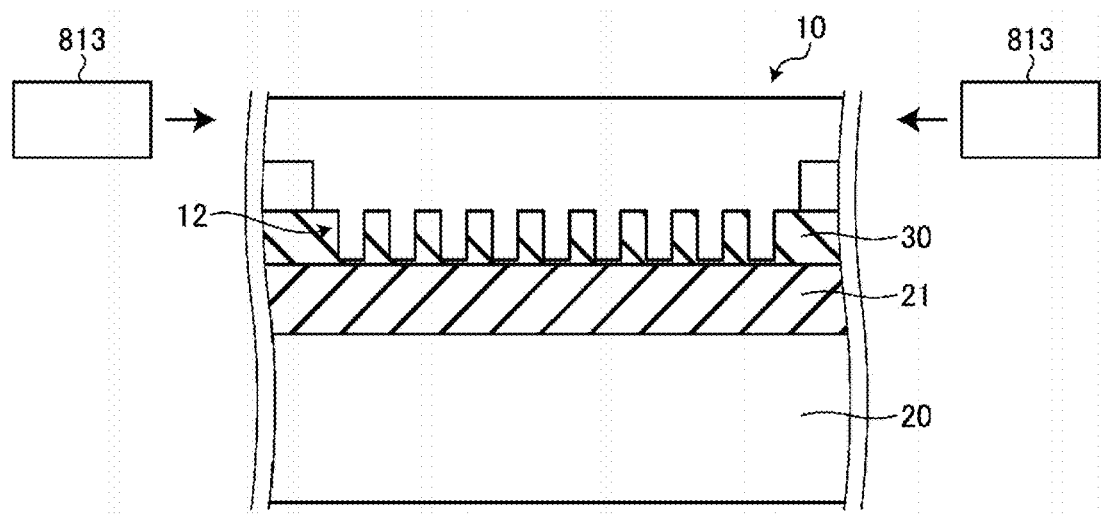

As illustrated in FIG. 6C, the pattern 12 of the template 10 is pressed against the resist film 30 of the wafer 20 by lowering the template stage 81.

At this time, the driving unit 814 adjusts a descending position of the template stage 81 so that a predetermined gap occurs between the template 10 and the processed film 21 of the wafer 20. Accordingly, the template 10 and the processed film 21 are prevented from coming into contact with each other.

In this way, the plurality of alignment marks 13 provided in the template 10 are observed by the image sensors 83 of the imprint apparatus 1 with the pattern 12 being brought into contact with the resist film 30, and a contact state between the pattern 12 and the resist film 30 is kept until the inside of the alignment marks 13 is filled with the resist film 30. Meanwhile, the recessed portion of the pattern 12 of the template 10 is filled with the resist film 30.

When the inside of the alignment marks 13 is filled with the resist film 30, visibility of the fine inspection marks $132x$ and $132y$ of the alignment marks 13 and the fine inspection marks $232x$ and $232y$ of the wafer 20 viewed through the template 10 is improved. That is, it is easy to observe the fine inspection marks $132x$, $132y$, $232x$, and $232y$ by the image sensors $84a$ to $84d$ of the imprint apparatus 1.

Therefore, after the filling with the resist film 30, while the individual fine inspection marks $132x$ and $132y$ of the template 10 and the individual fine inspection marks $232x$ and $232y$ of the wafer 20 corresponding to the individual fine inspection marks $132x$ and $132y$ are observed by the image sensors $84a$ to $84d$, the alignment of the wafer 20 and the template 10 in the direction along the surface of the wafer 20 is performed. At this time, for example, while the used image sensors $84a$ to $84d$ are appropriately switched, the fine inspection marks $132x$, $132y$, $232x$, and $232y$ located at the positions corresponding to the image sensors $84a$ to $84d$ are observed to perform the appropriate alignment.

Similarly, the individual fine inspection marks $132x$ and $132y$ of the template 10 and the individual fine inspection marks $232x$ and $232y$ corresponding to the individual fine inspection marks $132x$ and $132y$ are observed while switching the used image sensors $84a$ to $84d$, the side surface of the template 10 is appropriately pressed by the plurality of pressing members 813 provided in the template stage 81 to match the magnification of the pattern 12 of the template 10 with the size of the shot region SH of the wafer 20, more specifically, the size of the transfer region 22 (see FIGS. 5A and 5B) in the shot region SH. At this time, the wafer information and the template information acquired from the other apparatuses are also referred to. A detailed technique for changing the magnification of the pattern 12 of the template 10 will be described below.

Figure 7A:
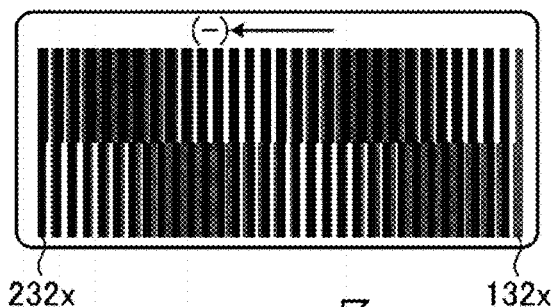
FIGS. 7A to 7D are sectional views sequentially illustrating a part of the procedure of the method of manufacturing the semiconductor device.
Figure 7B:
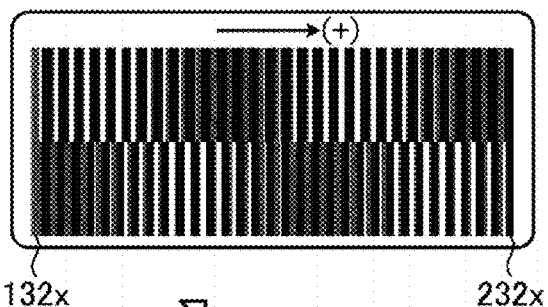
Figure 7C:
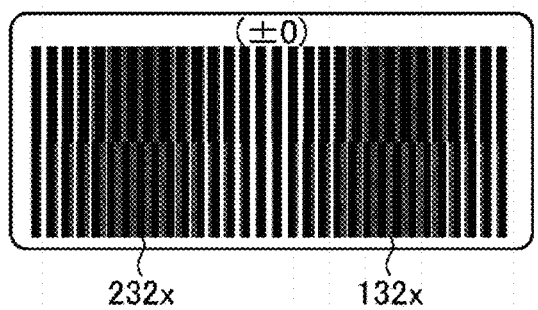

FIGS. 7A to 7C illustrate images of the fine inspection marks $132x$ and $232x$ captured by any of the image sensors $84a$ to $84d$ and a situation of the alignment performed using the fine inspection marks $132x$ and $232x$ between the wafer 20 and the template 10.

As described above, a period of the fine inspection marks $132x$ of the template 10 in the X direction is slightly different from a period of the fine inspection marks $232x$ of the wafer 20 in the X direction. When the fine inspection marks $132x$ and $232x$ are vertically overlapped in such a configuration, an interference fringe called moire occurs. When the relative position of the template 10 to the wafer 20 is moved in the X direction with the fine inspection marks $132x$ and $232x$ being mutually overlapped, the interference fringe is moved in the X direction.

FIG. 7A illustrates a state where the template 10 deviates from the wafer 20 in the –X direction when the left side of the paper surface in the horizontal direction is the –X direction and the right side is the +X direction. FIG. 7B illustrates a state where the template 10 deviates from the wafer 20 in the +X direction. FIG. 7C illustrates a state where a positional deviation between the wafer 20 and the template 10 in the X direction is zero.

For example, by detecting movements of the interference fringe as signal waveforms in images captured by the above-described image sensors 84 and performing a process using a least-squares method, it is possible to calculate a positional deviation between the template 10 and the wafer 20 in the X direction.

Alignment performed in the Y direction using the fine inspection marks $132y$ and $232y$ between the wafer 20 and the template 10 can also be performed in this way. That is, by moving the relative position of the template 10 to the wafer 20 in the Y direction while observing the fine inspection marks $132y$ and $232y$ by the corresponding image sensors $84a$ to $84d$ and detecting movements of the interference fringe as signal waveforms, a positional deviation between the template 10 and the wafer 20 in the Y direction is calculated.

As described above, for example, by detecting and analyzing the interference fringe in the fine inspection marks $132x$ and $232x$ and the fine inspection marks $132y$ and $232y$ as electrical signals, it is possible to quantify the positional deviation between the template 10 and the wafer 20 more accurately, and thus it possible to align the template 10 and the wafer 20 more accurately.

In this way, the alignment performed using the fine inspection marks $132x$ and $232x$ and the fine inspection marks $132y$ and $232y$ is also referred to as accurate alignment, fine alignment, or the like. The fine inspection marks $132x$ and $232x$ and the fine inspection marks $132y$ and $232y$ causing such an interference fringe are also referred to as moire-type alignment marks.

When the fine alignment is performed, at least one of the wafer 20 and the template 10 may also be rotated in the rotational direction in a plane by at least one of the wafer stage 82 and the template stage 81 and alignment in the rotational direction between the shot region SH and the pattern 12 may also be performed.

In the fine alignment performed using the fine inspection marks $132x$, $232x$, $132y$, and $232y$, a predetermined positional error can also occur between the template 10 and the wafer 20 actually in both the X and Y directions. Even in this case, a positional deviation equal to or less than a predetermined amount is allowed in the imprint process.

Accordingly, in an actual alignment operation, for example, when a period in which an alignment operation is performed is set in advance and a predetermined time comes, the alignment operation may end. Alternatively, when upper limits of positional deviations of the fine inspection marks $132x$ and $232x$ and the fine inspection marks $132y$ and $232y$ in the X and Y directions are set in advance and the positional deviations become the upper limits or less, the alignment operation may end.

Alternatively, both an alignment operation period and a threshold of an alignment error can also be set. When the alignment error becomes the threshold or less or when the alignment operation period passes and a timeout comes, the alignment operation can end.

Figure 7D:
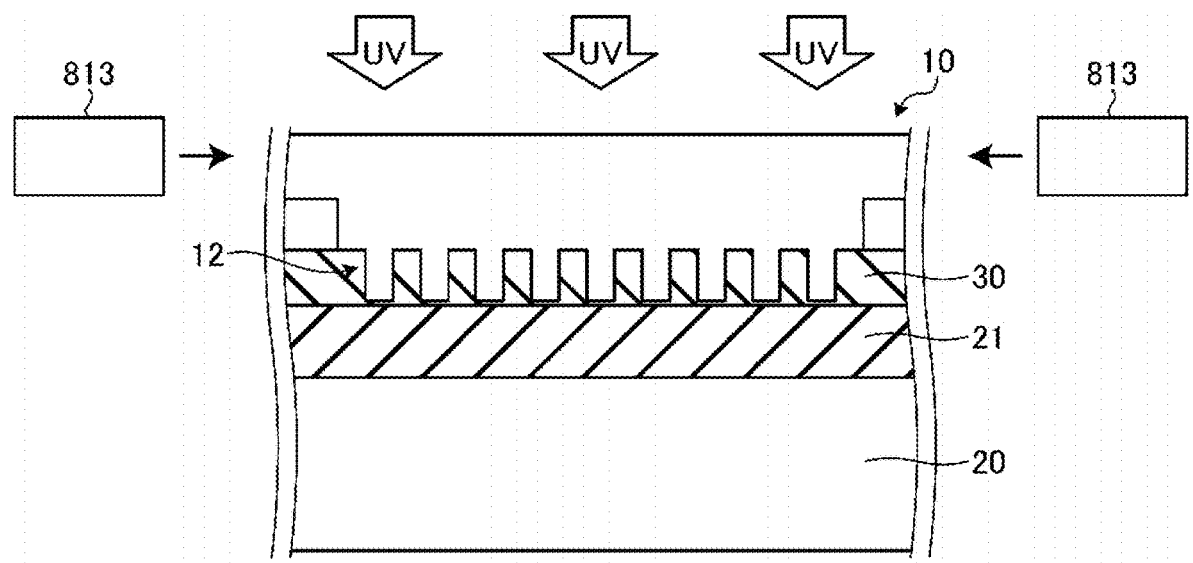

As illustrated in FIG. 7D, while the positions of the wafer 20 and the template 10 are kept after the end of the alignment between the wafer 20 and the template 10, ultraviolet light is radiated to the resist film 30 via the template 10. Accordingly, the resist film 30 is hardened with the recessed portion of the pattern 12 being filled.

Figure 8A:
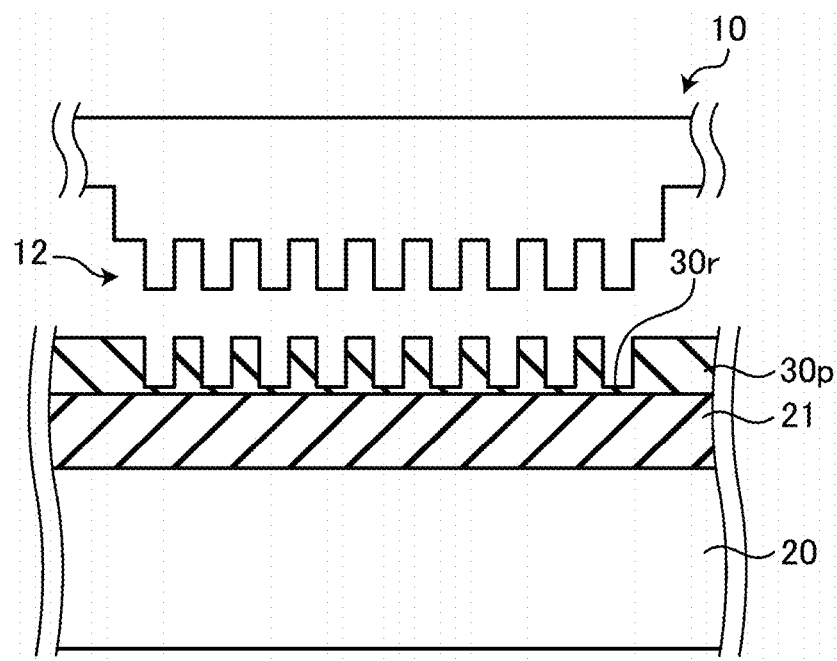
FIGS. 8A to 8C are sectional views sequentially illustrating a part of the procedure of the method of manufacturing the semiconductor device.

As illustrated in FIG. 8A, the template 10 is lifted by the driving unit 814 provided in the template stage 81. At this time, since the wafer 20 is adsorbed by the wafer chuck 82b, the wafer 20 is not peeled from the wafer stage 82 and the template 10 can be released from the wafer 20.

Accordingly, a resist pattern 30p to which the pattern 12 of the template 10 is transferred is formed. A thin film called a residual resist film 30r is formed on the bottom of the pattern having the resist pattern 30p. As described above, this is because the template 10 is pressed with a gap being formed with the wafer 20 in order to prevent contact between the template 10 and the wafer 20.

In this way, the imprint process by the imprint apparatus 1 according to the embodiment ends.

Figure 8B:
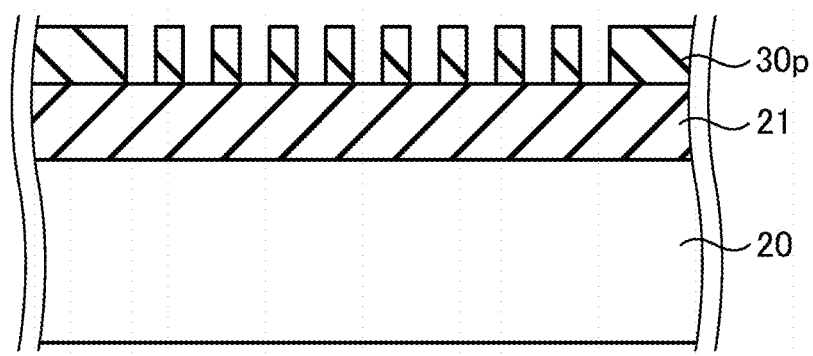

As illustrated in FIG. 8B, for example, the entire surface of the resist pattern 30p is processed through a process using an oxygen plasma or the like to remove the residual resist film 30r on the bottom of the pattern. Accordingly, the front surface of the processed film 21 is exposed to the bottom of the pattern.

Figure 8C:
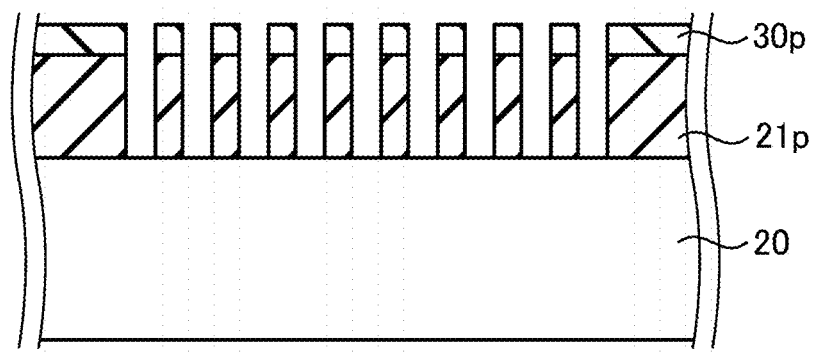

As illustrated in FIG. 8C, a processed film pattern 21p in which the resist pattern 30p is transferred to the processed film 21 is formed by performing an etching process on the processed film 21 via the resist pattern 30p.

Thereafter, for example, by burying the processed film pattern 21p with a metal film such as tungsten or copper, it is possible to obtain a desired structure which is a part of the semiconductor device.

For example, when the pattern 12 of the template 10 is a line-and-space pattern, the processed film pattern 21p also has a line-and-space pattern. By burying the processed film pattern 21p with the metal film, it is possible to obtain wirings or the like of the semiconductor device.

When the pattern 12 of the template 10 is a dot pattern, the processed film pattern 21p has a hole pattern in which the dot pattern is reversed. Here, by burying the processed film pattern 21p with the metal film, it is possible to obtain contacts, vias, or the like of the semiconductor device.

Thereafter, by further forming various types of films on the wafer 20 and repeating predetermined processes on these films, the semiconductor device according to at least one embodiment is manufactured.

In the imprint apparatus 1 according to at least one embodiment, as described above, the alignment in the X and Y directions of the template 10 and the wafer 20 is performed using the alignment marks 13 and 23 of the template 10 and the wafer 20. Accordingly, when the pattern 12 of the template 10 is transferred to the resist film 30, it is possible to improve overlapping accuracy of the pattern 12 with respect to various configurations formed in the wafer 20 in the processes.

By improving the overlapping accuracy of the pattern 12, a wiring of the processed film 21 with a contact or the like formed in an underlayer of the processed film 21 is connected more reliably, for example, when the imprint process is a process of forming the wiring in the processed film 21. For example, when the imprint process is a process of forming the contact or the like in the processed film 21, a wiring or the like formed in an underlayer of the processed film 21 is connected more reliably with the contact of the processed film 21.

(Operation Example of Imprint Apparatus)

Next, a detailed example of a magnification changing operation by the imprint apparatus 1 according to the embodiment will be described with reference to FIGS. 9 to 11.

In the imprint apparatus 1, as described above, a magnification of the shot region SH of the wafer 20 is changed and a magnification of the pattern 12 of the template 10 is changed. When the magnifications of the shot regions SH and the pattern 12 are changed, the wafer information and the template information acquired from the other apparatuses are referred to, and as will be described below, captured images of the alignment marks 13 and 23 are also referred to.

The magnification of the shot region SH is changed after the wafer 20 and the template 10 are imported in the imprint apparatus 1 and before the imprint process starts. More specifically, the control unit 90 of the imprint apparatus 1 moves the wafer stage 82 to a position at which the predetermined shot region SH is vertically overlapped with the pattern 12 of the template 10 among the plurality of shot regions SH of the wafer 20. The control unit 90 captures images in which the plurality of rough inspection marks 231 of the shot region SH are vertically overlapped with the plurality of corresponding rough inspection marks 131 of the template 10 by the image sensors 83 and uses the images to change the magnification of the shot region SH.

Figure 9C:
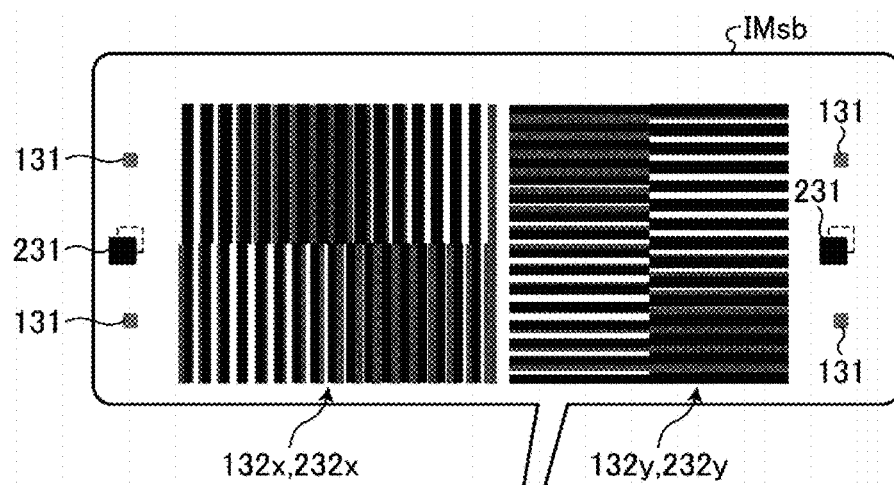
FIGS. 9A to 9C are schematic views illustrating examples of captured images referred to when magnification of a shot region is changed by the imprint apparatus.
Figure 9A:
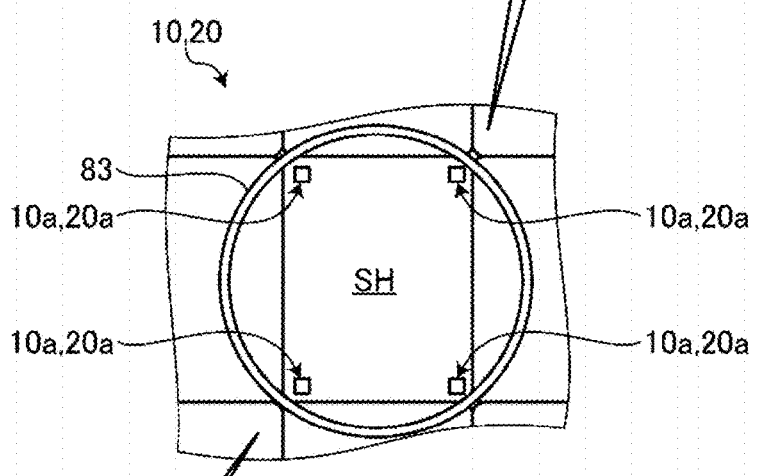
Figure 9B:
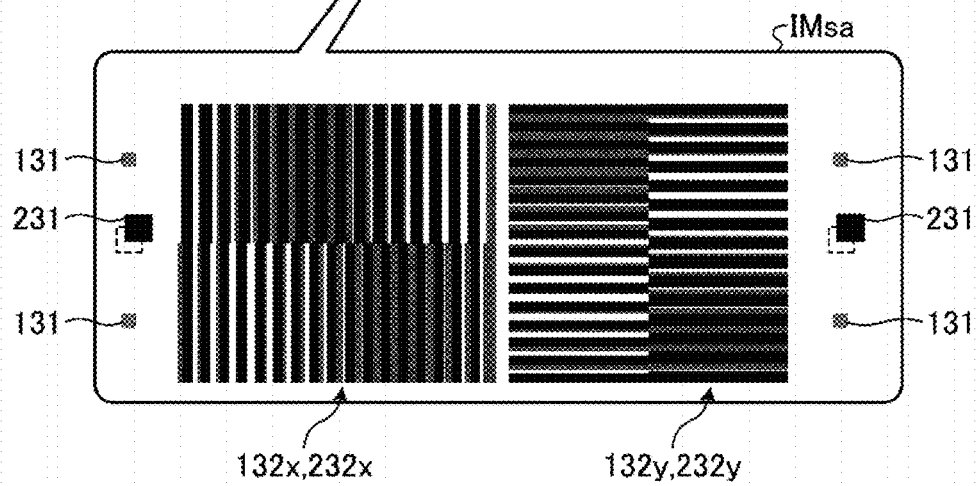

FIGS. 9A to 9C are schematic views illustrating examples of captured images IMsa and IMsb referred to when the magnification of the shot region SH is changed by the imprint apparatus 1 according to the embodiment.

FIG. 9A is a top view illustrating a situation where the plurality of alignment marks 13 of the template 10 and the plurality of alignment marks 23 corresponding to the plurality of alignment marks 13 are overlapped when viewed from the upper side of the template 10.

FIG. 9B illustrates a captured image IMsa of the alignment marks 13 and 23 disposed in one corner of the pattern 12 of the template 10 and the shot region SH of the wafer 20 among the plurality of mutually overlapped alignment marks 13 and 23. FIG. 9C illustrates a captured image IMsb of the alignment marks 13 and 23 located in a diagonal corner of the alignment marks 13 and 23 illustrated in FIG. 9B among the plurality of mutually overlapped alignment marks 13 and 23.

Here, an angle of field of the image sensor 83 can include all the alignment marks 13 and 23 in the shot region SH. Accordingly, images of the entire shot region SH including the captured images IMsa and IMsb may be able to be generated through one-time imaging of the image sensor 83.

As illustrated in FIG. 9A, to obtain data used to change the magnification of the shot region SH, the control unit 90 causes the image sensors 83 to image the plurality of alignment marks 13 and 23 located in the shot region SH. Accordingly, as in FIGS. 9B and 9C, a situation where the plurality of alignment marks 13 and 23 are vertically overlapped is observed.

In the example of FIG. 9B, in the alignment marks 13 and 23 in the bottom left corner of the paper surface captured by the image sensors 83, the rough inspection marks 231 of the wafer 20 deviate from the rough inspection marks 131 of the template 10 in the upper right direction of the paper surface, that is, the central direction of the shot region SH.

In the example of FIG. 9C, in the alignment marks 13 and 23 in the top right corner of the paper surface captured by the image sensors 83, the rough inspection marks 231 of the wafer 20 deviate from the rough inspection marks 131 of the template 10 in the lower left direction of the paper surface, that is, the central direction of the shot region SH.

For example, in the alignment marks 13 and 23 of the top left corner of the paper surface and the alignment marks 13 and 23 in the bottom right corner of the paper surface in the shot region SH, similarly, the shot region SH is formed at a small magnification with respect to the pattern 12 of the template 10, for example, when the rough inspection marks 231 of the wafer 20 deviates from the rough inspection marks 131 of the template 10 in the central direction of the shot region SH.

Actually, the control unit 90 predicts relative positions of the plurality of rough inspection marks 131 and 231 from the wafer information and the template information acquired from the other apparatuses and calculates a difference in a size of an observation target shot region SH with respect to the pattern 12 of the template 10, that is, a magnification error, based on a difference in actual relative positions of the plurality of rough inspection marks 131 and 231 in the observation target shot region SH.

In this way, the control unit 90 of the imprint apparatus 1 calculates the magnification error of the shot region SH based on the plurality of rough inspection marks 131 and 231 in a predetermined shot region SH with reference to the above-described wafer information and template information.

At this time, it is preferable to calculate the magnification error of the shot region SH using, for example, the alignment marks 13 and 23 distant from each other as far as possible, such as the four corners of the shot region SH among the alignment marks 13 and 23 located in the shot region SH. Accordingly, it is possible to obtain the magnification error of the shot region SH with high accuracy.

It is preferable to calculate such a magnification error based on a captured image of the shot region SH which can become, for example, a representative value of the magnification error such as the shot region SH disposed at the center of the wafer 20 among the plurality of shot regions HS. Alternatively, magnification errors of several shot regions SH such as a center of the wafer 20, both ends in the X direction, both ends in the Y direction among the plurality of shot regions SH of the wafer 20 may be obtained and an average value or the like of the obtained magnification errors may be set as the magnification error of the representative value of the plurality of shot regions SH.

Based on the magnification error obtained as described above, the control unit 90 controls the temperature control unit 820 such that the temperature of the wafer 20 is adjusted to reduce the magnification error of the shot region SH with respect to the pattern 12 of the template 10.

That is, as in the example of FIGS. 9A to 9C, when the magnification of the shot region SH with respect to the pattern 12 of the template 10 is small, the temperature is raised to expand the wafer 20 and the magnification of the shot region SH is increased. When the magnification of the shot region SH with respect to the pattern 12 of the template 10 is large, the temperature is lowered to contract the wafer 20 and the magnification of the shot region SH is decreased.

When the temperature of the wafer 20 is adjusted in this way, the magnification error of the shot region SH may be calculated based on, for example, one wafer 20 or several wafers 20 in one lot and the temperature of the wafer 20 which is based on the magnification error may be applied to all the wafers 20 corresponding to one lot. Alternatively, the magnification errors of the shot regions in all the wafers 20 may be obtained and a temperature to be applied may be changed for each wafer 20.

The magnification error between the pattern 12 of the template 10 and the shot region SH of the wafer 20 is also adjusted by changing the magnification of the pattern 12 using the pressing members 813 provided in the template stage 81, as will be described in detail below. A changeable range of the magnification of the pattern 12 by the pressing members 813 is, for example, 6.6 ppm or less. Accordingly, when the magnification of the shot region SH is changed, the temperature of the wafer 20 may be adjusted so that a relative magnification of the shot region SH becomes about 3.0 ppm which is a central value of a magnification change range of the pattern 12.

It is conceivable that the temperature change range of the wafer 20 is, for example, about room temperature ±1° C., or about room temperature ±0.5° C., in view of a ratio of the change in the temperature of the wafer 20 to a change in the magnification of the shot region SH, a variation in the magnification of the shot region SH due to a manufacturing error of the semiconductor device, a variation in the magnification of the pattern 12 due to a manufacturing error of the template 10, a changeable range of the magnification of the pattern 12 with respect to the pressing members 813, and the like.

Figure 10C:
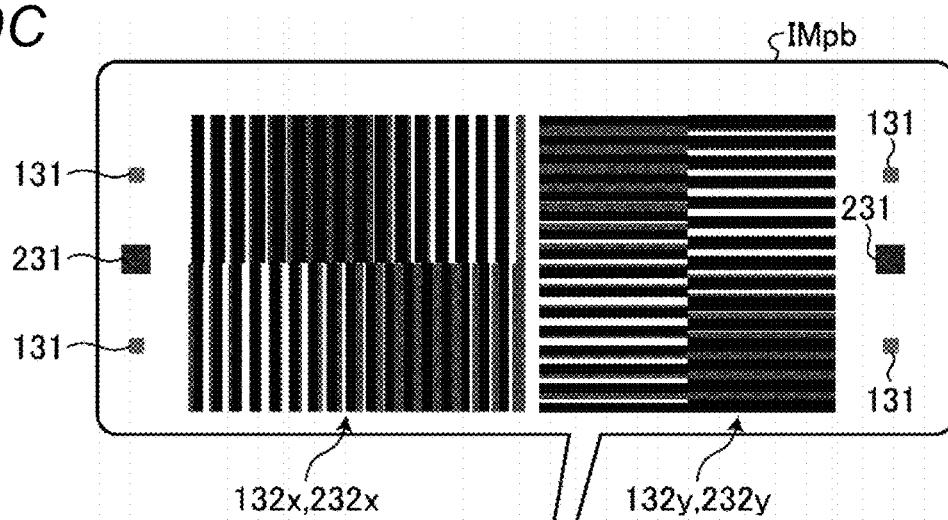
FIGS. 10A to 10C are schematic views illustrating examples of captured images referred to in a change in magnification of a pattern by the imprint apparatus.
Figure 10A:
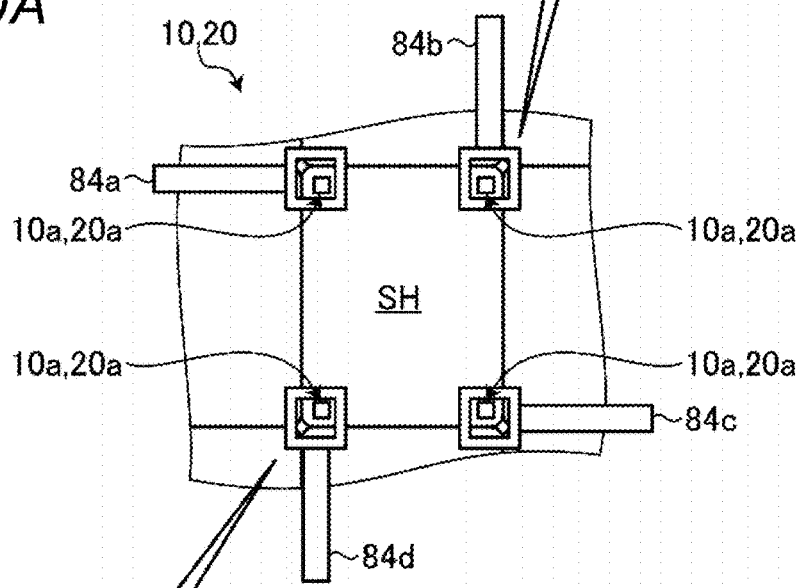
Figure 10B:
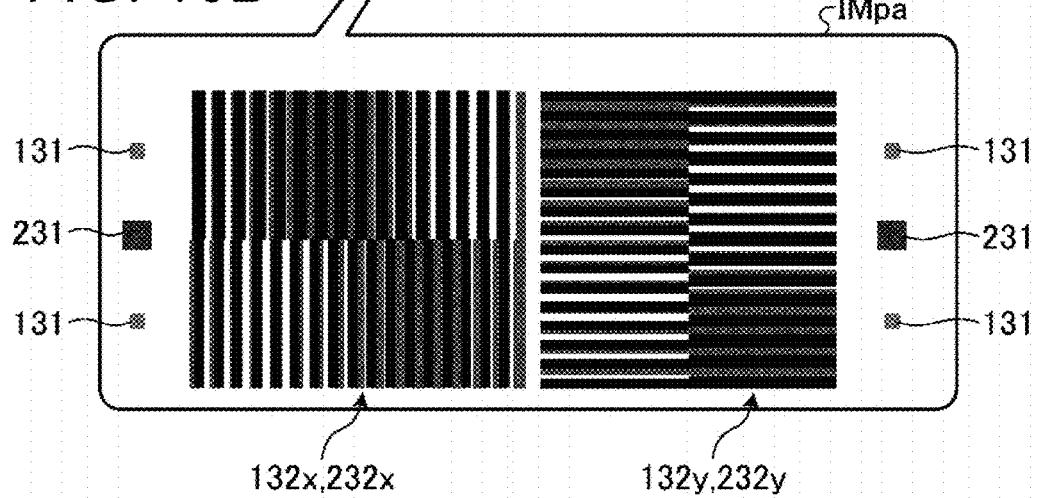

FIGS. 10A to 10C are schematic views illustrating examples of captured images IMpa and IMpb referred to in a change in magnification of a pattern 12 by the imprint apparatus 1 according to at least one embodiment.

As illustrated in FIG. 10A, to obtain data used to change the magnification of the pattern 12, the control unit 90 causes the image sensors 84a to 84d to image specific alignment marks 13 and 23 among the plurality of alignment marks 13 and 23 located in the shot region SH.

In the example of FIG. 10A, the control unit 90 causes the image sensor 84a to image the alignment marks 13 and 23 in the top left corner of the paper surface of the rectangular shot region SH, causes the image sensor 84b to image the alignment marks 13 and 23 in the top right corner of the paper surface, causes the image sensor 84c to image the alignment marks 13 and 23 in the bottom right corner of the paper surface, and causes the image sensor 84d to image the alignment marks 13 and 23 in the bottom left corner of the paper surface.

At this time, it is preferable to image the alignment marks 13 and 23 distant from each other as far as possible in the four corners or the like of the shot region SH among the alignment marks 13 and 23 located in the shot region SH by using all the image sensors 84a to 84d provided in the imprint apparatus 1 and to calculate a magnification error of the pattern 12 with respect to the shot region SH based on the images. Accordingly, it is possible to obtain the magnification error of the pattern 12 with high accuracy.

Based on the magnification error obtained as described above, the control unit 90 controls the pressing members 813 such that the size of the template 10 is adjusted to reduce the magnification error of the pattern 12 of the template 10 with respect to the shot region SH. By using the pressing members 813, it is possible to change not only the magnification of the pattern 12 but also the exterior form of the pattern 12.

FIGS. 11A to 11D are schematic views illustrating an example of control of the exterior form of the pattern 12 of the template 10 by the imprint apparatus 1 according to the embodiment.

Figure 11A:
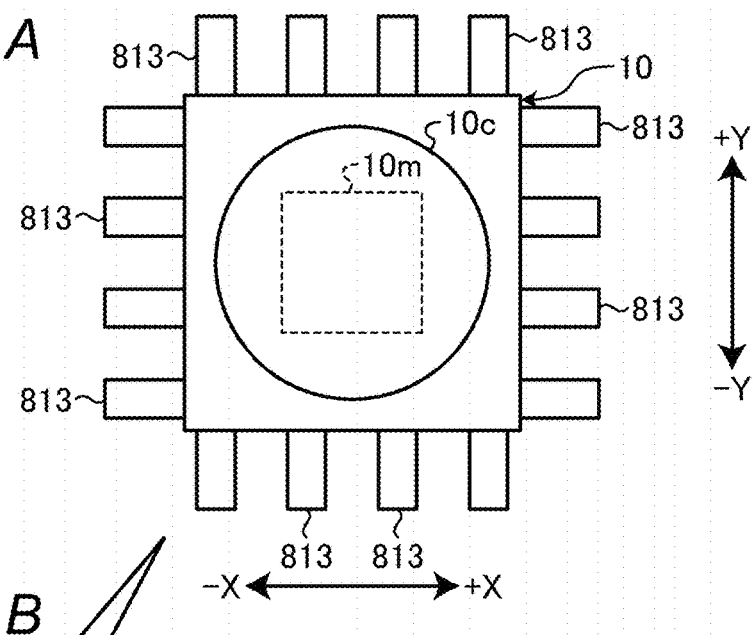
FIGS. 11A to 11D are schematic views illustrating an example of an exterior form control of a pattern of a template by the imprint apparatus.
Figure 11B:
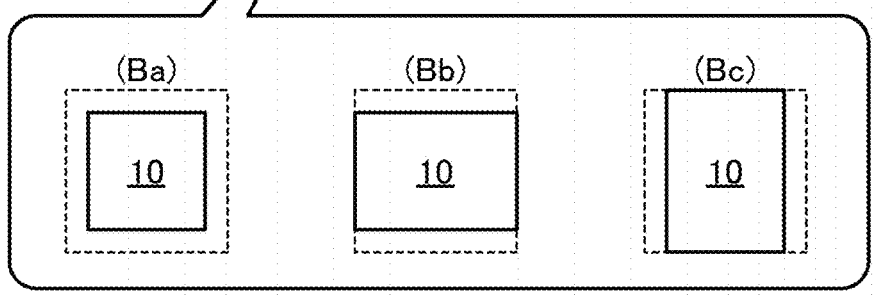
Figure 11C:
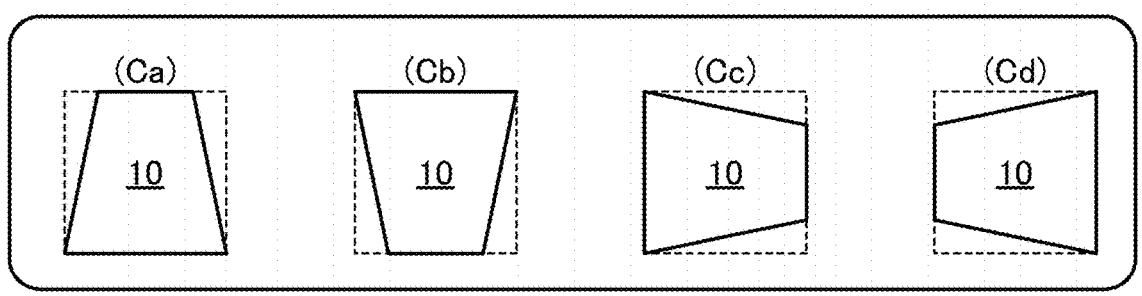
Figure 11D:
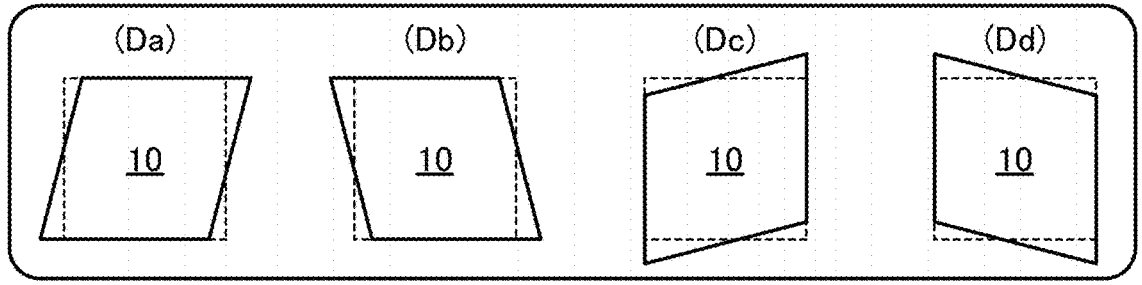

FIG. 11A is a top view illustrating the pressing member 813 of the template stage 81 and the template 10, as described above. FIG. 11B is a schematic view illustrating correction of the magnification of the pattern 12 by the pressing members 813. FIG. 11C is a schematic view illustrating an operation of correcting the pattern 12 to trapezoidal forms by the pressing members 813. FIG. 11D is a schematic view illustrating skew correction of the pattern 12 by the pressing members 813.

As illustrated in FIG. 11A, it is assumed that the rightward and leftward directions of the paper surface in FIGS. 11A to 11D are the +X and −X directions, respectively. It is assumed that the upward and downward directions of the paper surface are the +Y and −Y directions, respectively.

As illustrated in (Ba) of FIG. 11, as an initial value before correction, the template 10 is in a state compressed at the maximum by the pressing members 813 and the magnification of the pattern 12 of the template 10 is minimized. When pressing forces of all the pressing members 813 are equally decreased from this state, the magnification of the pattern 12 can be gradually increased.

As illustrated in (Bb) and (Bc) of FIG. 11, magnifications of the pattern 12 in the X and Y directions can also be different.

In the example illustrated in (Bb) of FIG. 11, the magnification of the pattern 12 in the Y direction is kept as a small magnification and the magnification of the pattern 12 in the X direction is increased by decreasing the pressing force on the side surface of the template 10 extending in the X direction. In the example illustrated in (Bc) of FIG. 11, the magnification of the pattern 12 in the X direction is kept as a small magnification and the magnification of the pattern 12 in the Y direction is increased by decreasing the pressing force on the side surface of the template 10 extending in the Y direction.

As illustrated in FIG. 11C, by causing the pressing forces of the plurality of pressing members 813 arranged in the X or Y direction to be different, the pattern 12 of the template 10 can also be set in a trapezoidal form.

In the example illustrated in (Ca) of FIG. 11, by decreasing the pressing force in the −Y direction among the plurality of pressing members 813 located in the Y direction, the pattern 12 is corrected to a trapezoidal form in which the side surface in the +Y direction is an upper base and the side surface in the −Y direction is a lower base.

In the example illustrated in (Cb) of FIG. 11, by decreasing the pressing force in the +Y direction among the plurality of pressing members 813 located in the Y direction, the pattern 12 is corrected to a trapezoidal form in which the side surface in the +Y direction is a lower base and the side surface in the −Y direction is an upper base.

In the example illustrated in (Cc) of FIG. 11, by decreasing the pressing force in the −X direction among the plurality of pressing members 813 located in the X direction, the pattern 12 is corrected to a trapezoidal form in which the side surface in the +X direction is an upper base and the side surface in the −X direction is a lower base.

In the example illustrated in (Cd) of FIG. 11, by decreasing the pressing force in the +X direction among the plurality of pressing members 813 located in the X direction, the pattern 12 is corrected to a trapezoidal form in which the side surface in the +X direction is a lower base and the side surface in the −X direction is an upper base.

As illustrated in FIG. 11D, by causing the pressing forces of the plurality of pressing members 813 facing in the X or Y direction to be different, skew correction may be performed to set the pattern 12 of the template 10 to an exterior form of a trapezoid.

In the example illustrated in (Da) of FIG. 11, the pressing force is decreased in the +Y direction in the pressing members 813 pressing the side surface of the template 10 in the +X direction among the plurality of pressing members 813 facing in the X direction. The pressing force in the −Y direction is decreased in the pressing members 813 pressing the side surface of the template 10 in the −X direction among the plurality of pressing members 813 facing in the X direction. Accordingly, it is possible to obtain the trapezoidal pattern 12 in which the side surfaces facing in the X direction are skewed and a corner in the −X direction and +Y direction and a corner in the +X direction and the −Y direction are at obtuse angle.

In the example illustrated in (Db) of FIG. 11, the pressing force is decreased in the −Y direction in the pressing members 813 pressing the side surface of the template 10 in the +X direction among the plurality of pressing members 813 facing in the X direction. The pressing force in the −X direction is decreased in the pressing members 813 pressing the side surface of the template 10 in the −X direction among the plurality of pressing members 813 facing in the X direction. Accordingly, it is possible to obtain the trapezoidal pattern 12 in which the side surfaces facing in the X direction are skewed and a corner in the +X direction and +Y direction and a corner in the −X direction and the −Y direction are at obtuse angle.

In the example illustrated in (Dc) of FIG. 11, the pressing force is decreased in the +X direction in the pressing members 813 pressing the side surface of the template 10 in the +Y direction among the plurality of pressing members 813 facing in the Y direction. The pressing force in the −X direction is decreased in the pressing members 813 pressing the side surface of the template 10 in the −Y direction among the plurality of pressing members 813 facing in the Y direction. Accordingly, it is possible to obtain the trapezoidal pattern 12 in which the side surfaces facing in the Y direction are skewed and a corner in the −X direction and +Y direction and a corner in the +X direction and the −Y direction are at obtuse angle.

In the example illustrated in (Dd) of FIG. 11, the pressing force is decreased in the −X direction in the pressing members 813 pressing the side surface of the template 10 in the +Y direction among the plurality of pressing members 813 facing in the Y direction. The pressing force in the +X direction is decreased in the pressing members 813 pressing the side surface of the template 10 in the −Y direction among the plurality of pressing members 813 facing in the Y direction. Accordingly, it is possible to obtain the trapezoidal pattern 12 in which the side surfaces facing in the Y direction are skewed and a corner in the −X direction and −Y direction and a corner in the +X direction and the +Y direction are at obtuse angle.

The exterior form of the pattern 12 of the template 10 is corrected using the pressing members 813 based on a positional relationship among the plurality of fine inspection marks 132x, 132y, 232x, and 232y in the predetermined shot region SH.

That is, with reference to the above-described wafer information and template information, for example, as illustrated in FIG. 6C to FIG. 7C described above, the control unit 90 of the imprint apparatus 1 performs the alignment in the direction along the surfaces of the template 10 with the wafer 20 and appropriately performs magnification correction, the trapezoidal correction, and the skew correction of the pattern 12 using the pressing members 813 while observing the plurality of fine inspection marks 132x, 132y, 232x, and 232y with the pattern 12 of the template 10 being brought into contact with the resist film 30 on the wafer 20.

In this way, the exterior form of the pattern 12 by the pressing members 813 is corrected in parallel to the fine alignment, for example, using the plurality of fine inspection marks 132x, 132y, 232x, and 232y.

In the correction of the exterior form of the pattern 12 of the template 10 in which the pressing members 813 are used, for example, the magnification of the pattern 12 can be corrected in a range of 0 ppm or more and 6.6 ppm or less. When the temperature of the wafer 20 is adjusted, as described above, the magnification of the shot region SH of the wafer 20 is corrected so that the relative magnification of the shot region SH to the pattern 12 is 3.0 ppm which is a central value of the magnification correction range of the pressing members 813. Then, when the magnification of the pattern 12 is corrected, the magnification of the pattern 12 can be corrected near a central position of a movable region of the pressing members 813, that is, near 50% of a usage rate of the pressing members 813. Accordingly, the relative magnification of the shot region SH to the pattern 12 can be matched in the magnification correction range of the pressing members 813.

(Processing Example of Imprint Apparatus)

Figure 12:
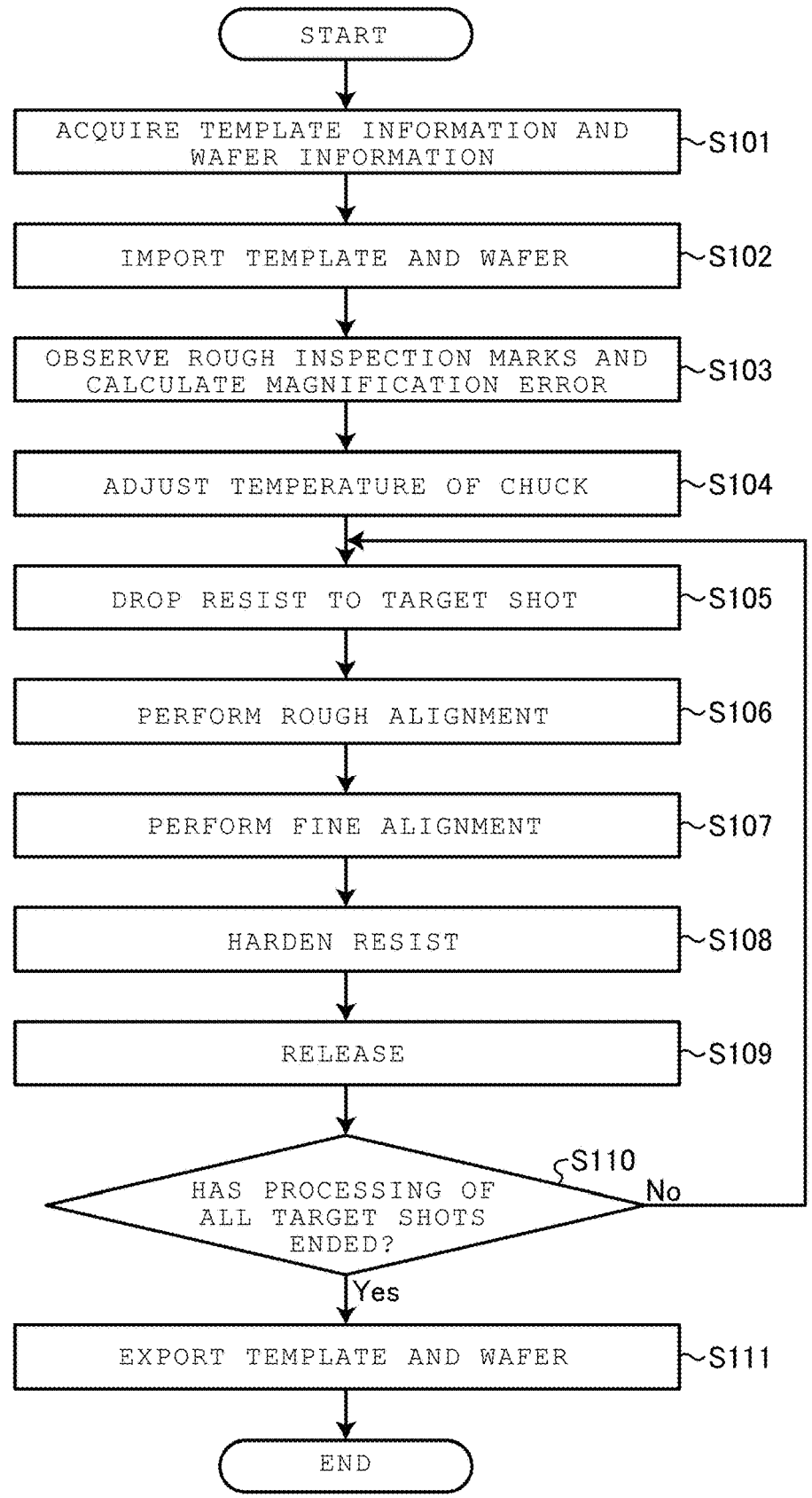
FIG. 12 is a flowchart illustrating an example of a procedure of an imprint process in the imprint apparatus.

Next, an example of the imprint process in the imprint apparatus 1 according to the embodiment will be described with reference to FIG. 12. FIG. 12 is a flowchart illustrating an example of a procedure of the imprint process in the imprint apparatus 1 according to the embodiment.

As illustrated in FIG. 12, when an instruction is received from a user or the like, the control unit 90 of the imprint apparatus 1 acquires wafer information of the processing target wafer 20 and template information of the template 10 having the pattern 12 transferred to the wafer 20 from the other apparatuses from a design apparatus and a measurement apparatus and stores the wafer information and the template information in the storage unit 91 (step S101).

The control unit 90 controls a conveyance mechanism (not illustrated) such that the template 10 and the wafer 20 are imported in the imprint apparatus 1 (step S102). The imported template 10 is mounted on the template stage 81 by the template chuck 812. The imported wafer 20 is placed on the wafer stage 82 and is adsorbed by the wafer chuck 82b.

The control unit 90 observes the vertically overlapped rough inspection marks 131 and 231 by the image sensors 83 and calculates a magnification error between the pattern 12 and the shot region SH by controlling the pattern 12 of the template 10 and the predetermined shot region SH on the wafer 20 such that the pattern 12 and the shot region SH are vertically overlapped (step S103). At this time, a magnification error between the plurality of shot regions SH disposed in different regions of the wafer 20 may be calculated.

The control unit 90 controls the temperature control unit 820 such that the temperature of the wafer 20 is adjusted based on the magnification error calculated for at least one shot region SH with reference to the wafer information and the template information acquired from the other apparatuses (step S104). Accordingly, the magnification of the shot region SH with respect to the pattern 12 is changed through expansion or contraction of the wafer 20 so that the magnification error is reduced. At this time, it is preferable to adjust the temperature of the wafer 20 so that the relative magnification of the shot region SH becomes the central value of the magnification correction range of the pattern 12 by the pressing members 813.

Thereafter, the control unit 90 starts the imprint process on the individual shot region SH.

That is, the control unit 90 causes the liquid dropping device 87 to drop liquid droplets of the resist to the processing target shot region SH (step S105), performs control such that the shot region SH and the pattern 12 of the template 10 are vertically overlapped, and performs rough alignment between the wafer 20 and the template 10 while observing the vertically overlapped rough inspection marks 131 and 231 by the image sensors 83 (step S106).

The control unit 90 causes the pattern 12 of the template 10 to come into contact with the resist film 30 on the wafer 20 by lowering the template stage 81, and performs the fine alignment between the wafer 20 and the template 10 while observing the vertically overlapped fine inspection marks 132x and 232x and the vertically overlapped fine inspection marks 132y and 232y by the image sensors 84 (step S107).

At this time, exterior form correction such as magnification correction, trapezoidal correction, and skew correction of the pattern 12 of the template 10 is performed in parallel using the pressing members 813 with reference to the wafer information and the template information acquired from the other apparatuses.

When the fine alignment or the like ends, the control unit 90 radiates light such as ultraviolet light from the light source 89 to harden the resist film 30 with the pattern 12 of the template 10 being pressed (step S108). The control unit 90 lifts the template stage 81 and releases the pattern 12 of the template 10 from the resist pattern 30p formed by the hardening (step S109).

Here, the control unit 90 determines whether the imprint process on all the target shot regions SH on the wafer 20 ends (step S110). When there is an unprocessed shot region SH (No in step S110), the process is repeated from step S105.

When the process on all the shot regions SH ends (Yes in step S110), the control unit 90 exports the wafer 20 from the imprint apparatus 1 by a conveyance mechanism (not illustrated) (step S111).

In this way, the imprint process in the imprint apparatus 1 according to the embodiment ends.

SUMMARY

In a process of manufacturing the semiconductor device, a plurality of shot regions are provided in a wafer and an imprint process is performed on each shot region by an imprint apparatus. A pattern of a template transferred to the shot region is provided to correspond to the shot region.

Here, sizes of the pattern and the shot region often vary because of a manufacturing error or the like. Therefore, the pattern of the template is designed to be slightly larger than the shot region. Further, in the imprint process, the relative magnification to an individual shot region is matched by pressing the side surface of the template by pressing members provided in the outer edge and reducing the magnification of the pattern.

However, when an error of a relative magnification of the shot region to the pattern of the template is too large, the error deviates from a range which can be corrected by the pressing members in some cases. When the pressing members reach a correction limit, further correction cannot be made. Therefore, the imprint process is performed with the magnification error between the shot region and the pattern of the template being large. In this case, an overlapping error between the shot region and the pattern may increase.

The imprint apparatus 1 according to at least one embodiment holds the wafer 20 on the wafer chuck 82b and adjusts a temperature of the wafer 20 by controlling the temperature control unit 820 based on the magnification error between the pattern 12 of the template 10 and the shot region SH of the wafer 20.

Accordingly, by changing the magnification of the shot region SH and reducing the magnification error from the pattern 12, it is possible to improve overlapping accuracy of the pattern 12 with respect to the wafer 20. Accordingly, it is possible to improve a yield of a semiconductor device.

In the imprint apparatus 1 according to at least one embodiment, the shot region SH and the pattern 12 have the plurality of alignment marks 23 and 13 at different positions of the outer edges of the shot regions SH and the pattern 12. The template 10 held by the template stage 81 is disposed above the wafer 20 held by the wafer chuck 82b. Based on images obtained by imaging the plurality of alignment marks 13 and 23 by the image sensors 83, the temperature control unit 820 is controlled to adjust the temperature of the wafer 20 and change the magnification of the shot region SH from a difference between the size of the shot region SH and the size of the pattern 12.

Accordingly, the relative magnification of the shot region SH can be calculated more accurately from the plurality of alignment marks 23 and 13 located in the outer edges of the shot region SH and the pattern 12. Accordingly, it is possible to match the relative magnification of the shot region SH to the pattern 12 more accurately.

In the imprint apparatus 1 according to at least one embodiment, after the magnification of the shot region SH is changed, the magnification of the pattern 12 is changed by the plurality of pressing members 813 while observing the alignment marks 13 and 23 via the template 10 by the image sensors 84.

By changing the magnification of the pattern 12 by the pressing members 813 after the change in the magnification of the shot region SH, it is possible to prevent the magnification error of the pattern 12 to the shot region SH from exceeding the magnification correction range of the pressing members 813. Accordingly, it is possible to correct the magnification error of the pattern 12 in the magnification correction range of the pressing members 813.

In the imprint apparatus 1 according to the embodiment, the alignment marks 23 include the rough inspection marks 231 referred to in adjustment of the temperature of the wafer 20 and the fine inspection marks 232x and 232y referred to in the change in the magnification of the pattern 12 and aligned more accurately than the rough inspection marks 231. The alignment marks 13 include the rough inspection marks 131 referred to together with the rough inspection marks 231 and the fine inspection marks 132x and 132y referred to together with the fine inspection marks 232x and 232y.

In this way, by using the rough inspection marks 131 and 231 for the magnification correction of the shot region SH used to expand or contract the wafer 20 through a change in a temperature and using the fine inspection marks 132x, 132y, 232x, and 232y for the magnification correction of the pattern 12 by the pressing members 813 capable of performing more accurate correction, it is possible to match the relative magnification of the shot region SH to the pattern 12 more accurately and quickly.

In the imprint apparatus 1 according to the embodiment, magnifications of the plurality of shot regions SH are changed based on images obtained by imaging the alignment marks 13 and 23 for every plurality of shot regions SH.

When the magnifications of the plurality of shot regions SH are changed, the temperature of the wafer 20 is adjusted uniformly by controlling the temperature control unit 820 and the magnifications of the plurality of shot regions SH are changed uniformly.

Accordingly, it is possible to calculate the relative magnification of the shot region SH more accurately from the magnification error calculated for the plurality of shot regions SH, and it is possible to match the relative magnification of the shot region SH to the pattern 12 more accurately.

In the above-described embodiment, based on the magnification error of the shot region SH obtained by observing the rough inspection marks 131 and 231 before the imprint process on the individual shot region SH starts, the temperature of the wafer 20 is adjusted. However, the calculation of the magnification error of the shot region SH and the adjustment of the temperature of the wafer 20 based on the magnification error may be performed based on the fine inspection marks 132x and 232x and the fine inspection marks 132y and 232y.

As described above, the fine inspection marks 132x, 132y, 232x, and 232y are configured to perform fine alignment with the pattern 12 of the template 10 being brought into contact with the resist film 30 on the wafer 20. However, even when the resist film 30 does not come in contact with the template 10, the fine inspection marks 132x and 232x and the fine inspection marks 132y and 232y can be observed with accuracy required to calculate the magnification error of at least the shot region SH by causing the wafer 20 to be close to the template 10 by a distance equal to or less than, for example, 10 μm.

When the magnification error of the shot region SH is calculated using the fine inspection marks 132x, 132y, 232x, and 232y, control is performed such that the pattern 12 of the template 10 and the predetermined shot region SH on the wafer 20 are vertically overlapped at a distance equal to or less than 10 μm and do not come into contact with each other.

The magnification error between the pattern 12 and the shot region SH in the X direction is calculated by observing the vertically overlapped fine inspection marks 132x and 232x by the image sensors 84. The magnification error between the pattern 12 and the shot region SH in the Y direction is calculated by observing the vertically overlapped fine inspection marks 132y and 232y by the image sensors 84.

At this time, it is preferable to use the fine inspection marks 232x and 232y provided at a plurality of locations in one shot region SH. The magnification error may be calculated for the plurality of shot regions SH disposed in different regions of the wafer 20.

In this way, even when the fine inspection marks 132x and 232x and the fine inspection marks 132y and 232y are used, the magnification error of the shot region SH can be calculated, and thus it is possible to obtain similar advantageous effects to those of the above-described embodiment.

Modification 1

Next, a configuration of Modification 1 of the embodiment will be described with reference to FIG. 13. An imprint apparatus according to Modification 1 is different from the imprint apparatus according to the above-described embodiment in that a refrigerant flow passage 828br branched into a plurality of flow passages is provided in a wafer chuck 182b.

Figure 13:
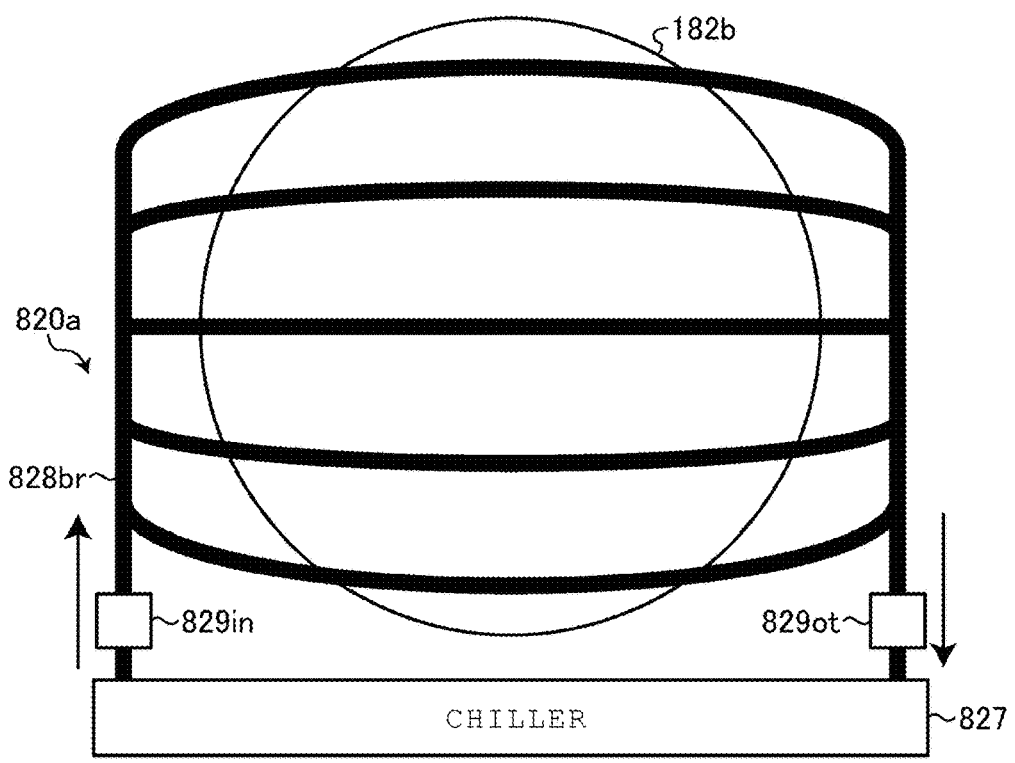
FIG. 13 is a top perspective view illustrating an example of a configuration of a wafer chuck provided in an imprint apparatus according to Modification 1 of the embodiment.

FIG. 13 is a top perspective view illustrating an example of a configuration of the wafer chuck 182b provided in an imprint apparatus according to Modification 1 of the embodiment.

As illustrated in FIG. 13, a temperature control unit 820a provided in the imprint apparatus according to Modification 1 includes a refrigerant flow passage 828br instead of the refrigerant flow passage 828 of the temperature control unit 820 according to the above-described embodiment. The refrigerant flow passage 828br is branched into a plurality of flow passages from an inflow port at one end of the wafer chuck 182b, is drawn into the wafer chuck 182b, and is directed to an outflow port at the other end of the wafer chuck 82b.

In this way, the refrigerant flow passage 828br branched into a plurality of flow passages is distributed to the entire surface of the wafer chuck 182b to be provided in the wafer chuck 182b, and thus it is possible to shorten a distance from the inflow port to the outflow port of the individually branched refrigerant flow passage 828b. Accordingly, it is possible to prevent a change in the temperature of a refrigerant in the inflow port to the wafer chuck 182b and the outflow port from the wafer chuck 182b, and thus it is possible to adjust the temperature of the wafer 20 more accurately.

A diameter, the number, and the like of branched refrigerant flow passages 828br and an extension direction or the like in the wafer chuck 182b can be appropriately set. That is, the number of refrigerant flow passages 828br may be more or less than in the example of FIG. 13 when the temperature of the wafer 20 can be adjusted accurately. In the example of FIG. 13, the wafer 20 is placed on the wafer chuck 182b so that the notch faces downward, so that the extension direction of the refrigerant flow passages 828br in the wafer chuck 182b is oriented in the horizontal direction of the paper surface. However, the extension direction of the refrigerant flow passages 828br may be oriented in the vertical direction of the paper surface or another direction.

In the imprint apparatus according to Modification 1, it is also possible to obtain similar advantageous effects to those of the imprint apparatus 1 according to the above-described embodiment.

Modification 2

Next, a configuration of Modification 2 of the embodiment will be described with reference to FIG. 14. An imprint apparatus according to Modification 2 is different from the imprint apparatus according to the above-described embodiment in that a plurality of refrigerant flow passages 828a to 828d are provided in the wafer chuck 282b.

Figure 14:
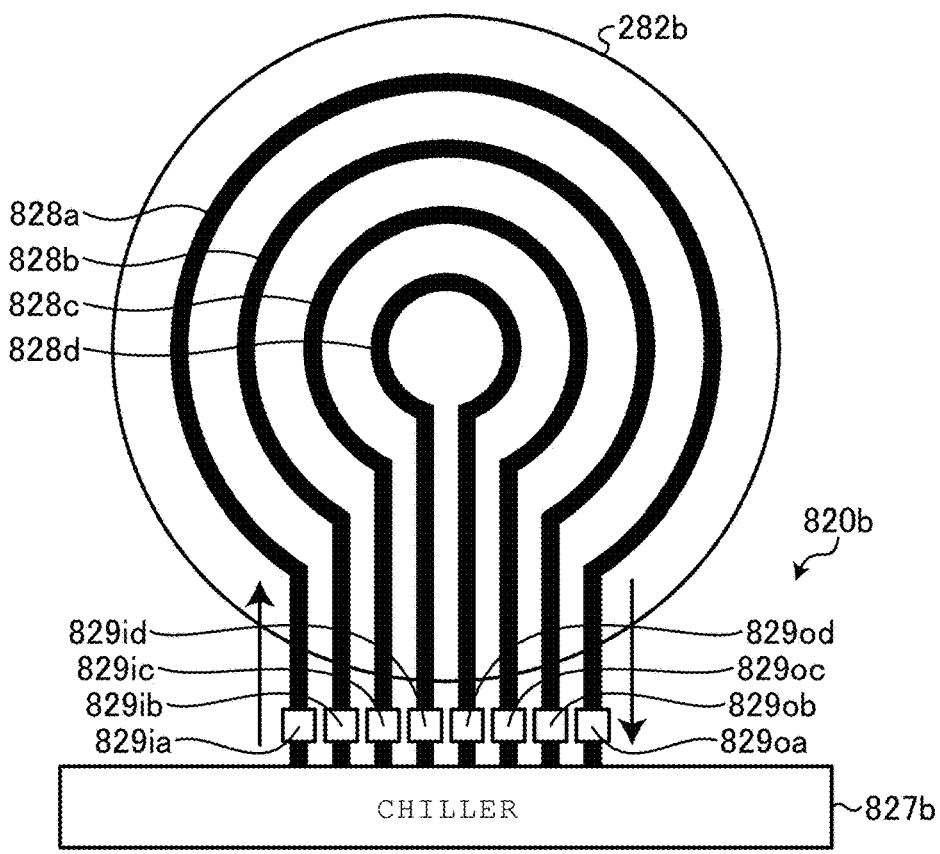
FIG. 14 is a top perspective view illustrating an example of a configuration of a wafer chuck provided in an imprint apparatus according to Modification 2 of the embodiment.

FIG. 14 is a top perspective view illustrating an example of a configuration of the wafer chuck 282b provided in an imprint apparatus according to Modification 2 of the embodiment.

As illustrated in FIG. 14, a temperature control unit 820b provided in the imprint apparatus according to Modification 2 includes a chiller 827b, the plurality of refrigerant flow passages 828a to 828d, and temperature sensors 829ia to 829id and 829oa to 829od instead of the chiller 827, the refrigerant flow passage 828, and the temperature sensors 829in and 829ot of the temperature control unit 820 according to the above-described embodiment.

The chiller 827b includes a plurality of channels (not illustrated) and circulates a refrigerant independently from the wafer chuck 282b by the individual channels. The chiller 827b can individually control the refrigerant circulated by the channels to different temperatures.

The plurality of refrigerant flow passages 828a to 828d are individually independent and each includes an inflow port and an outflow port of the refrigerant to the wafer chuck 282b. The refrigerant flow passage 828a is circulated near the outer edge of the wafer chuck 282b along the outer edge of the wafer chuck 282b from the inflow port at one end of the wafer chuck 282b and is directed to the outflow port at the end of the wafer chuck 282b on the same side as that of the inflow port. The refrigerant flow passage 828b surrounds the inner side of the wafer chuck 822b than the refrigerant flow passage 828a along the outer edge of the wafer chuck 282b like the refrigerant flow passage 828a. The refrigerant flow passage 828c surrounds the further inner side of the wafer chuck 822b than the refrigerant flow passage 828b along the outer edge of the wafer chuck 282b like the refrigerant flow passages 828a and 828b. The refrigerant flow passage 828d surrounds the further inner side of the wafer chuck 822b than the refrigerant flow passage 828c along the outer edge of the wafer chuck 282b like the refrigerant flow passages 828a to 828c.

The temperature sensors 829ia to 829id are provided in the inflow ports of the plurality of refrigerant flow passages 828a to 828d and output detection results of a temperature of the refrigerant to the chiller 827b. The temperature sensors 829oa to 829od are provided in the outflow ports of the plurality of refrigerant flow passages 828a to 828d and output detection results of a temperature of the refrigerant to the chiller 827b. The chiller 827b individually controls the temperature of the refrigerant circulated through the refrigerant flow passages 828a to 828d based on the detection results from the temperature sensors 829ia to 829id and 829oa to 829od.

A diameter, the number, and the like of refrigerant flow passages 828a to 828d can be appropriately set. That is, the number of refrigerant flow passages 828a to 828d may be more or less than in the example of FIG. 14 when the temperature of the wafer 20 can be adjusted accurately.

The temperature control unit 820b according to Modification 2 can control the wafer 20 to a different temperature for each region because the wafer chuck 282b is divided into zones from the outer circumferential region to the inner circumferential region by the plurality of refrigerant flow passages 828a to 828d.

Accordingly, for example, relative magnifications of the plurality of shot regions SH disposed at positions corresponding to the temperature regions can be calculated and the individual regions can be controlled appropriately to different temperatures based on the calculation result. Accordingly, it is possible to change the relative magnification of the individual shot region SH more appropriately.

In the imprint apparatus according to Modification 2, it is also possible to obtain similar advantageous effects to those of the imprint apparatus 1 according to the above-described embodiment.

Modification 3

Next, a configuration of Modification 3 of the embodiment will be described with reference to FIG. 15. An imprint apparatus according to Modification 3 is different from the imprint apparatus according to the above-described embodiment in that a wafer chuck 382b is configured as an electrostatic chuck.

Figure 15A:
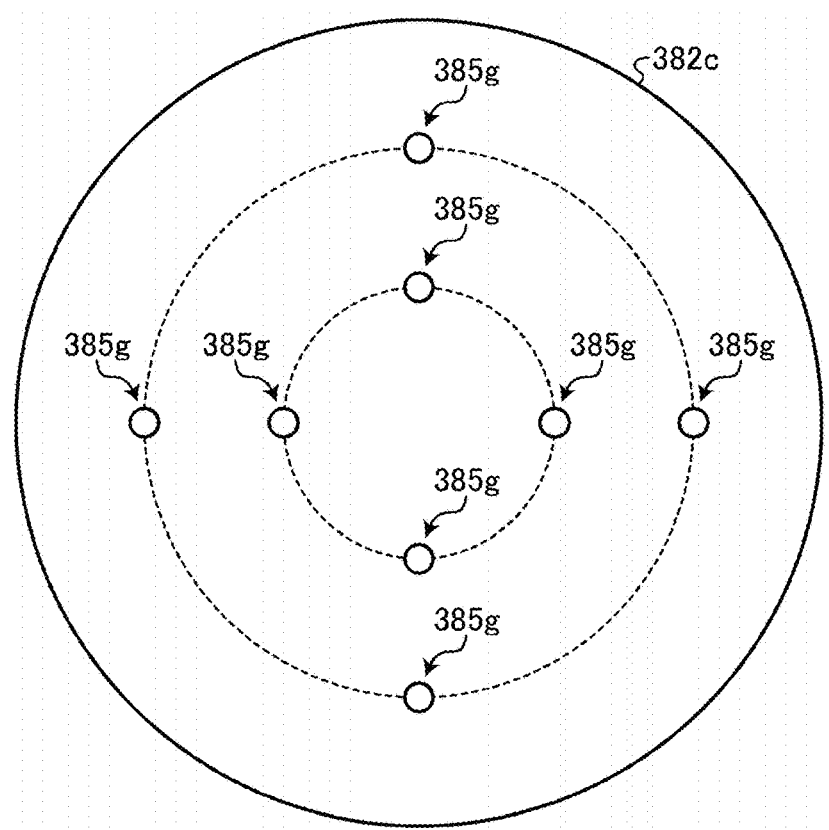
FIGS. 15A and 15B are schematic views illustrating an example of a configuration of a wafer chuck provided in an imprint apparatus according to Modification 3 of the embodiment.
Figure 15B:
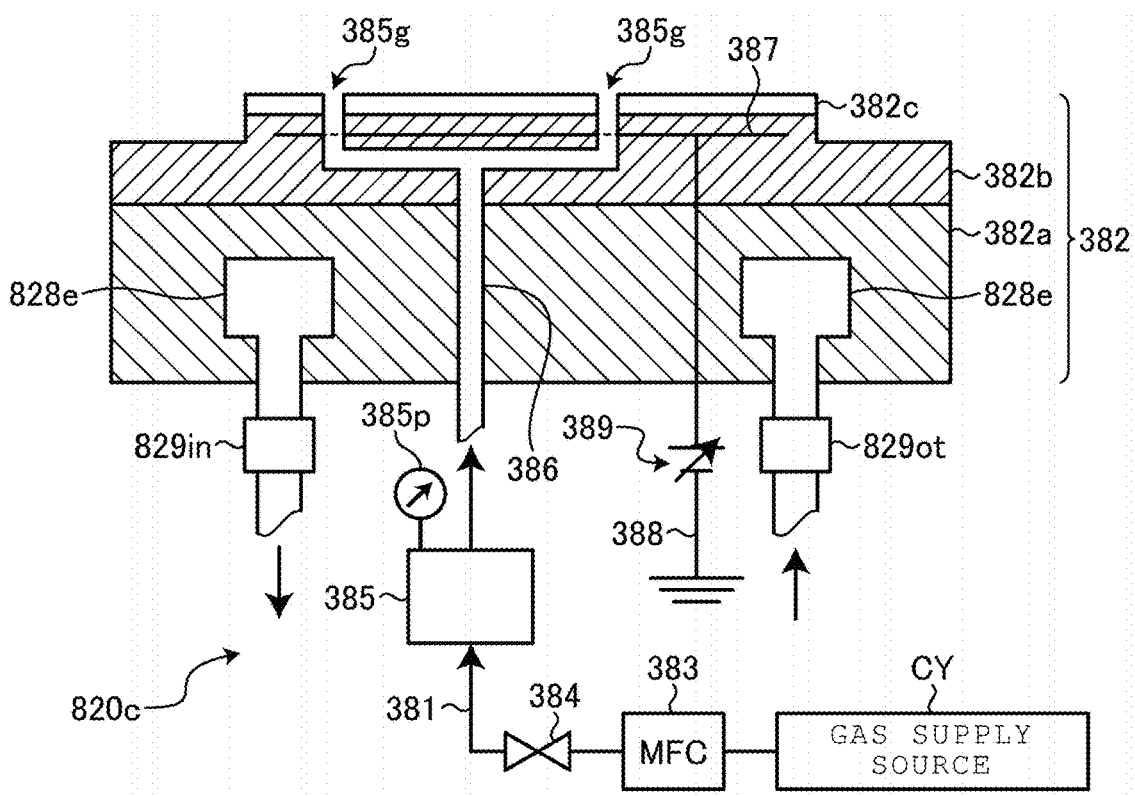

FIGS. 15A and 15B are schematic views illustrating an example of a configuration of the wafer chuck 382b provided in an imprint apparatus according to Modification 3 of the embodiment. FIG. 15A is a top view illustrating the wafer chuck 382b and FIG. 15B is a view illustrating a configuration of a temperature control unit 820c according to Modification 3 in addition to a cross-sectional view of the wafer stage 382.

As illustrated in FIGS. 15A and 15B, the wafer stage 382 provided in the imprint apparatus according to Modification 3 includes a body 382a, the wafer chuck 382b, and a ceramic plate 382c. The ceramic plate 382c is placed on the outermost surface of the wafer stage 382 and serves as a placement surface of the wafer 20.

The wafer chuck 382b is interposed between the body 382a and the ceramic plate 382c and a chuck electrode 387 is buried near the ceramic plate 382c of the wafer chuck 382b. A power supply 389 is connected to the chuck electrode 387 via a feeding line 388. In such a mechanism, direct-current power is supplied from the power supply 389 to the chuck electrode 387, the upper surface of the wafer stage 382 is charged electrostatically, and the wafer 20 is adsorbed.

In this way, the wafer chuck 382b according to Modification 3 is configured as an electrostatic chuck that electrostatically adsorbs the wafer 20.

The temperature control unit 820c provided in the imprint apparatus according to Modification 3 includes a gas supply pipe 381, a mass flow controller (MFC) 383, a valve 384, a tank 385, a gas flow passage 386, a refrigerant flow passage 828e, temperature sensors 829in and 829ot, and a chiller (not illustrated).

The refrigerant flow passage 828e is provided in the body 382a of the wafer stage 382. The refrigerant flow passage 828e may have any design such as the meandering flow passage like the refrigerant flow passage 828 according to the above-described embodiment or the branched flow passages like the refrigerant flow passage 828br according to Modification 1. Alternatively, the refrigerant flow passage 828e according to Modification 3 may also include a plurality of independent refrigerant flow passages like the refrigerant flow passages 828a to 828d according to Modification 2.

In a body 382e of the refrigerant flow passage 828e, the temperature sensor 829in is provided in an inflow port and the temperature sensor 829ot is provided in an outflow port. The chiller controls a temperature of the refrigerant based on detection results of the temperature sensors 829in and 829ot.

The gas flow passage 386 penetrates through the wafer stage 382 and has a plurality of openings 385g opened to the front surface of the ceramic plate 382c. The plurality of openings 385g are distributed to the entire surface of the ceramic plate 382c. When a plurality of independent refrigerant flow passages are set in the refrigerant flow passage 828e, a plurality of independent gas flow passages may be set in the gas flow passage 386.

A downstream end of the gas supply pipe 381 which has an upstream end to which a gas supply source CY is connected is connected to the upstream end of the gas flow passage 386. The gas supply source CY stores, for example, a gas such as an He gas, $CO_2$ gas or an Ar gas with high thermal conductivity. In the gas supply pipe 381, the MFC 383, the valve 384, and the tank 385 are provided in order from the upstream side. In the tank 385, a pressure sensor 385p measuring a pressure in the tank 385 is provided.

By opening the valve 384 of the gas supply pipe 381, a flow rate of the gas flowing out from the gas supply source CY is controlled by the MFC 383. The gas is temporarily stored in the tank 385, a pressure of the gas is adjusted, and the gas diffuses from the plurality of openings 385g of the ceramic plate 382c between the front surface of the ceramic plate 382c and the rear surface of the wafer 20.

The control unit of the imprint apparatus according to Modification 3 controls a pressure in the tank 385 by causing the MFC 383 to change a flow rate of the gas based on a measurement result of the pressure sensor 385p. Accordingly, the gas temporarily stored in the tank 385 is supplied at a predetermined pressure to the plurality of openings 385g of the ceramic plate 382c. In this way, the tank 385 functions as a pressure control unit that controls a pressure of a gas supplied to the wafer stage 382.

In this way, in the temperature control unit 820c according to Modification 3, the gas flow passage 386 through which the gas with high thermal conductivity flows is disposed near the refrigerant flow passage 828e in which the refrigerant of which the temperature is controlled flows and is on the side closer to the ceramic plate 382c which is a placement surface of the wafer 20 than the refrigerant flow passage 828e.

Accordingly, heat is exchanged between the refrigerant flowing in the refrigerant flow passage 828e and the gas flowing in the gas flow passage 386, so that the gas is controlled to a predetermined temperature. The gas controlled to the predetermined temperature diffuses to the rear surface of the wafer 20 so that the temperature of the wafer 20 can be adjusted.

As described above, when a plurality of independent refrigerant flow passages are set in the refrigerant flow passage 828e and a plurality of independent gas flow passages are set in the gas flow passage 386, the wafer chuck 382b is divided into a plurality of zones so that adjustment to a different temperature for each zone can be achieved.

In the imprint apparatus according to Modification 3, it is also possible to obtain similar advantageous effects to those of the imprint apparatus 1 according to the above-described embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An imprint apparatus comprising:
    a chuck including a temperature controller configured to adjust a temperature of a substrate having a shot region, the chuck being configured to hold the substrate;
    a template stage configured to hold a template so that a surface of the template with a pattern faces the substrate, and configured to change a relative position of the substrate to the template in a vertical direction; and
    a controller configured to control the chuck and the template stage,
    wherein the controller is configured to calculate a magnification error between the pattern and the shot region, control the temperature controller such that the temperature of the substrate is adjusted based on the calculated magnification error, and
    control the template stage such that the pattern of the template is transferred to the shot region of the substrate after the temperature of the substrate is adjusted.

2. The imprint apparatus according to claim 1, further comprising:
an image sensor configured to image the substrate via the template,
wherein the shot region has a plurality of first alignment marks at different positions of outer edges of the shot region,
wherein the template has a plurality of second alignment marks corresponding to the plurality of first alignment marks, and
wherein the controller is configured to control the temperature controller from a difference between a size of the shot region and a size of the pattern based on images, the images being obtained by causing the image sensor to image the plurality of first alignment marks and the plurality of second alignment marks via the template.

3. The imprint apparatus according to claim 2,
wherein the template stage further includes a plurality of actuators configured to press the different positions of the outer edge of the template and change magnification of the pattern, and
wherein the controller is configured to change the magnification of the pattern by the plurality of actuators while causing the image sensor to observe the first and second alignment marks via the template before the pattern is transferred to the shot region.

4. The imprint apparatus according to claim 1,
wherein the chuck is divided into a plurality of regions, and
wherein the temperature controller is configured to adjust the temperature of the substrate at each of the plurality of regions.

5. The imprint apparatus according to claim 1, wherein the temperature controller includes
a refrigerant flow passage through which a refrigerant is circulated to control a temperature of the chuck, and
a chiller configured to control a temperature of the refrigerant.

6. The imprint apparatus according to claim 5, wherein the chuck is a suction chuck adsorbing the substrate.

7. The imprint apparatus according to claim 5, wherein the temperature controller further includes
a gas flow passage which is provided closer to the substrate than the refrigerant flow passage and through which a gas with a predetermined thermal conductivity is circulated, and
a pressure controller configured to control a pressure of the gas circulated through the gas flow passage.

8. The imprint apparatus according to claim 7, wherein the chuck is an electrostatic chuck adsorbing the substrate by an electrostatic force.

9. The imprint apparatus according to claim 1, wherein the chuck includes inner annular regions.

10. The imprint apparatus according to claim 1, wherein the chuck includes a plurality of substrate pins configured to hold the substrate above the chuck.

11. A pattern forming method comprising:
holding a substrate with a shot region above a chuck configured to adjust a temperature of the substrate;
calculating a magnification error between a pattern of the template and the shot region;
adjusting the temperature of the substrate based on the magnification error; and
after adjusting the temperature of the substrate, transferring the pattern of the template to the shot region.

12. The method of claim 11, wherein the substrate includes a wafer.

13. The method of claim 12, wherein the wafer includes a silicon wafer.

14. The method of claim 11, wherein the shot region has a rectangular shape.

15. A method of manufacturing a semiconductor device, the method comprising:
holding a semiconductor substrate with a shot region above a chuck configured to adjust a temperature of the substrate;
calculating a magnification error between a pattern of the template and the shot region;
adjusting the temperature of the semiconductor substrate based on the magnification error; and
after adjusting the temperature of the substrate, transferring the pattern of the template to the shot region.

* * * * *